(12) United States Patent
Ishibashi

(10) Patent No.: US 8,791,446 B2
(45) Date of Patent: Jul. 29, 2014

(54) SEMICONDUCTOR DEVICE

(71) Applicant: Kabushiki Kaisha Toshiba, Minato-ku (JP)

(72) Inventor: Yutaka Ishibashi, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/039,027

(22) Filed: Sep. 27, 2013

(65) Prior Publication Data
US 2014/0021427 A1    Jan. 23, 2014

Related U.S. Application Data

(62) Division of application No. 13/040,018, filed on Mar. 3, 2011, now abandoned.

(30) Foreign Application Priority Data

May 17, 2010   (JP) ................................. 2010-113533

(51) Int. Cl.
  *H01L 47/00*   (2006.01)
  *H01L 27/10*   (2006.01)
  *H01L 23/48*   (2006.01)

(52) U.S. Cl.
  USPC .................... 257/4; 257/5; 257/211; 257/774

(58) Field of Classification Search
  USPC ............ 257/3–5, 208, 211, 773, 774, E23.01, 257/E29.002, E31.001
  See application file for complete search history.

(56) References Cited

U.S. PATENT DOCUMENTS

| 7,112,815 | B2 | 9/2006 | Prall |
|---|---|---|---|
| 7,199,050 | B2 * | 4/2007 | Hiatt ............................. 438/667 |
| 7,956,443 | B2 * | 6/2011 | Akram et al. ................. 257/621 |
| 8,222,677 | B2 | 7/2012 | Baba et al. |
| 8,363,472 | B2 | 1/2013 | Nagashima |
| 2005/0184329 | A1 * | 8/2005 | Prall ............................. 257/314 |
| 2010/0032725 | A1 | 2/2010 | Baba et al. |

FOREIGN PATENT DOCUMENTS

| JP | 10-163203 | 6/1998 |
|---|---|---|
| JP | 11-121618 | 4/1999 |
| JP | 2000-91423 | 3/2000 |
| JP | 2005-522045 | 7/2005 |
| JP | 2005-268480 | 9/2005 |
| JP | 2006-512776 | 4/2006 |
| JP | 2008-147447 | 6/2008 |
| JP | 2009-130140 | 6/2009 |
| JP | 2010-40977 | 2/2010 |

OTHER PUBLICATIONS

Office Action issued Jul. 2, 2013 in Japanese Application No. 2010-113533 (w/ English translation).

* cited by examiner

*Primary Examiner* — Hung Vu
(74) *Attorney, Agent, or Firm* — Oblon, Spivak, McClelland, Maier & Neustadt, L.L.P.

(57) ABSTRACT

According to one embodiment, a semiconductor device includes a substrate and an interconnect region on the substrate. The interconnect region includes a first interconnect having a first contact portion whose plane shape is a ring-like plane shape, a second interconnect disposed below the first interconnect, and a contact electrode passing through the ling-like portion of the first contact portion and electrically connecting the first interconnect and the second interconnect.

16 Claims, 27 Drawing Sheets

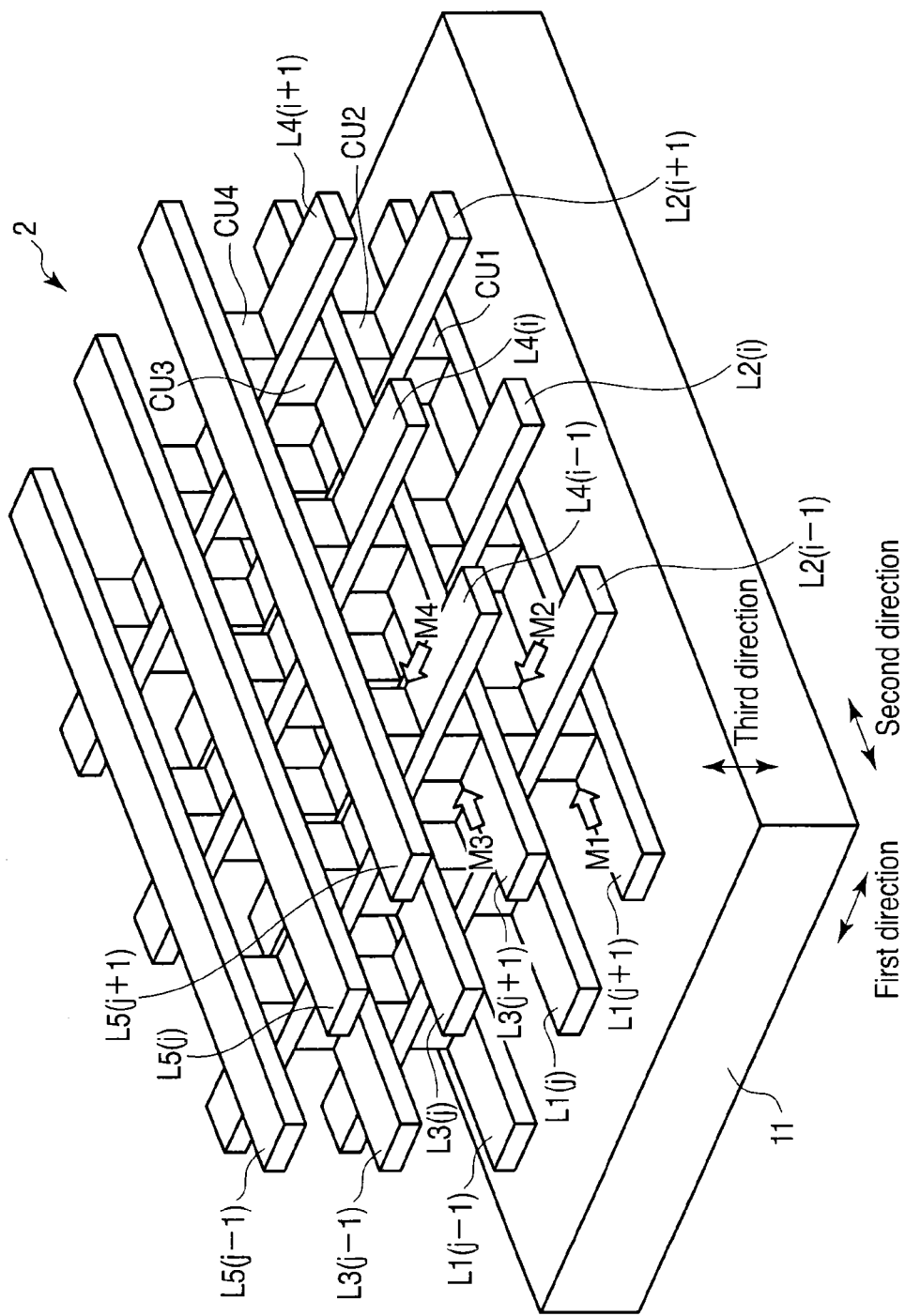
F I G. 2

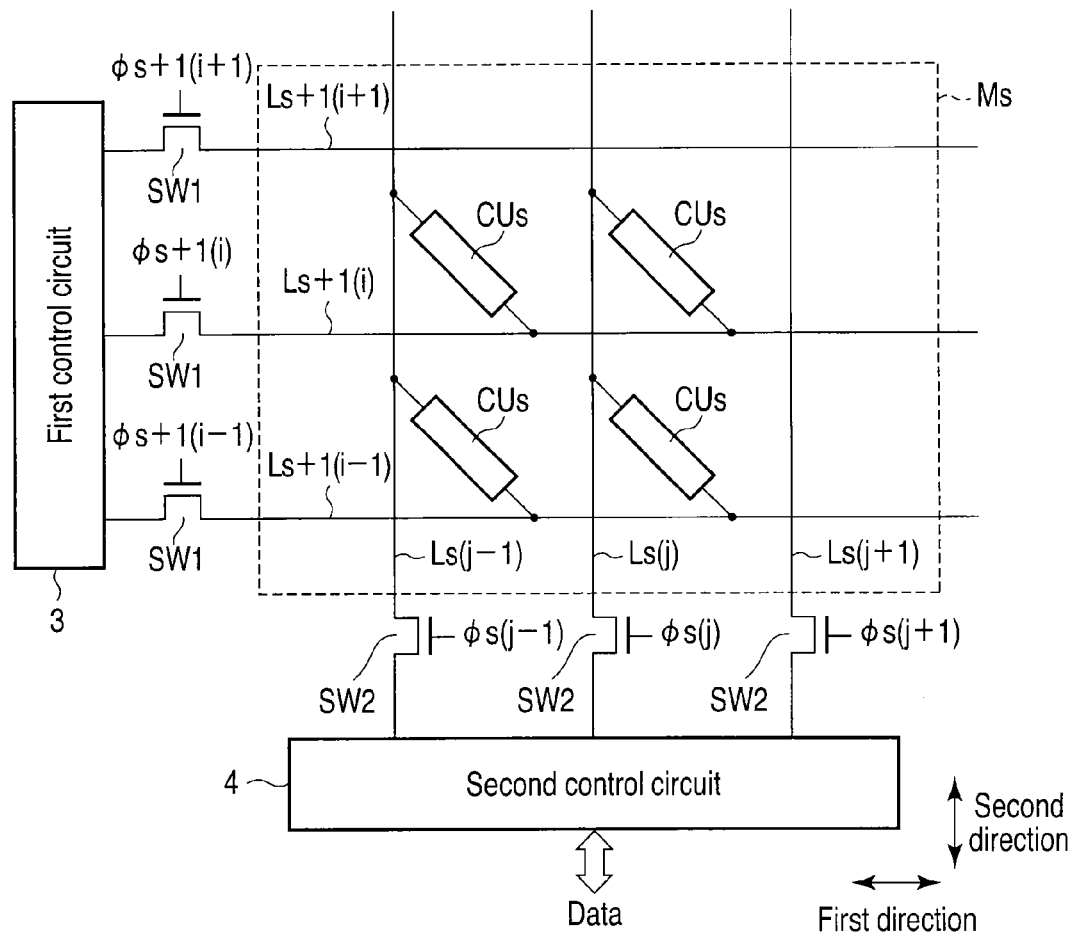
F I G. 5A

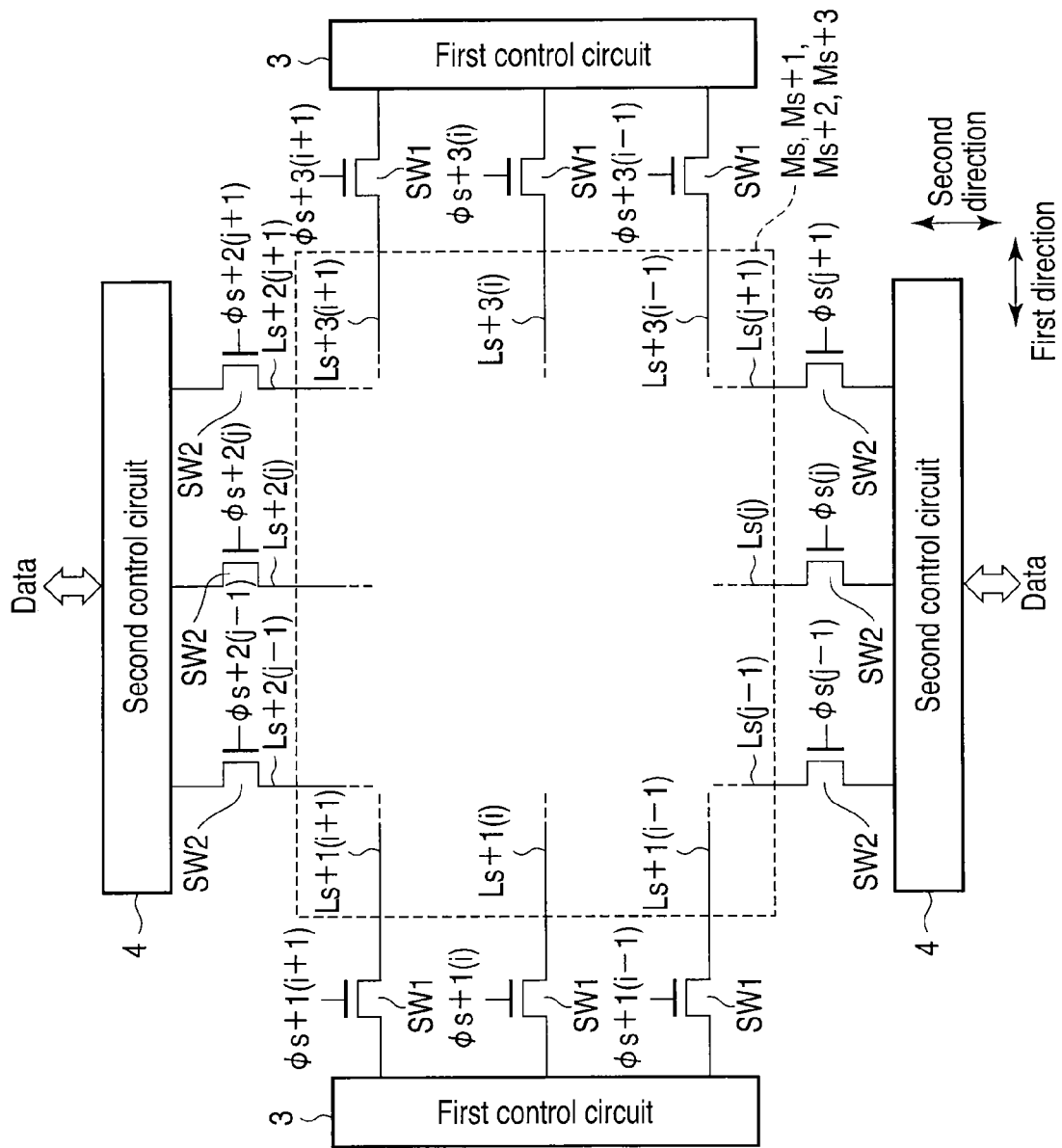
F I G. 6

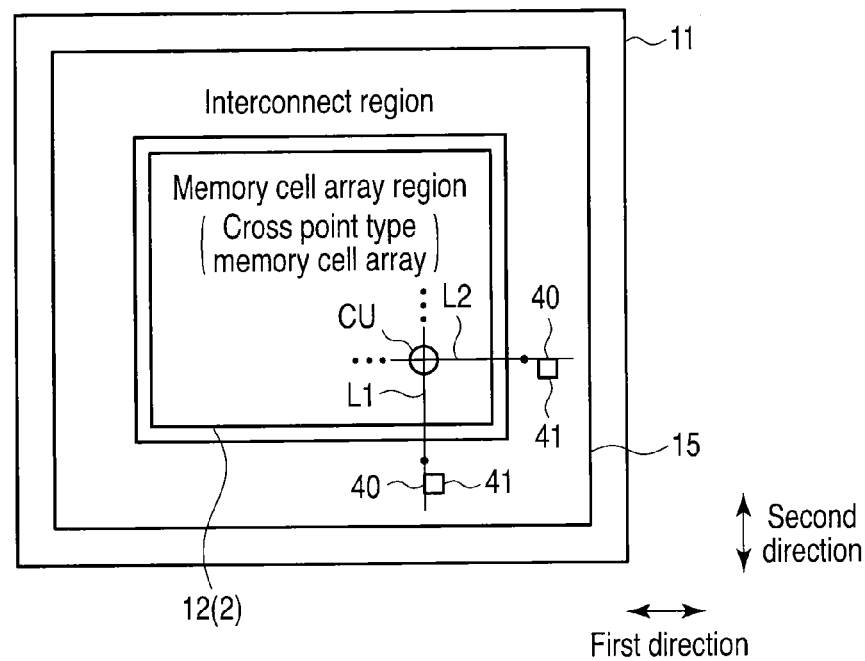
F I G. 7
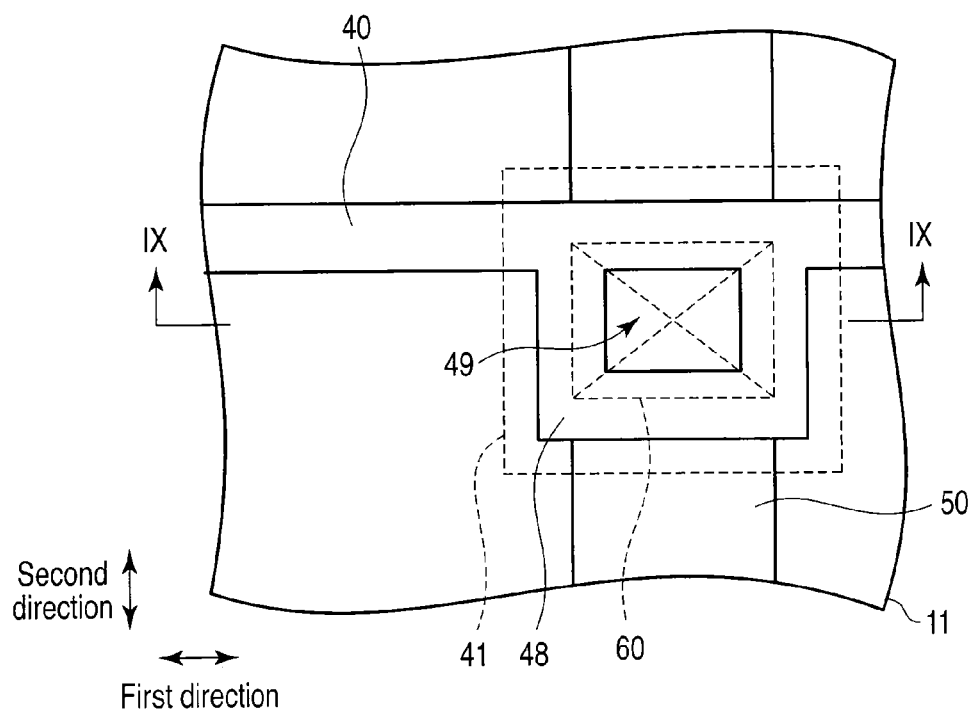
F I G. 8

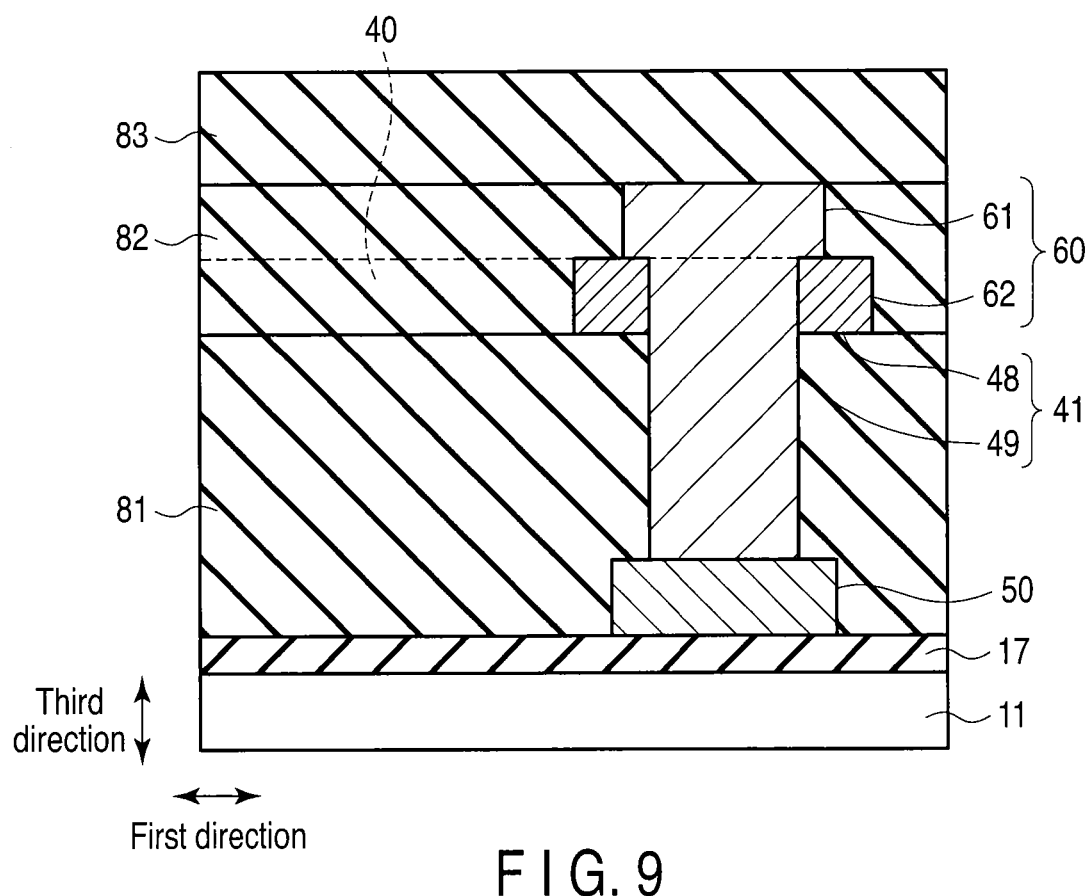
F I G. 9

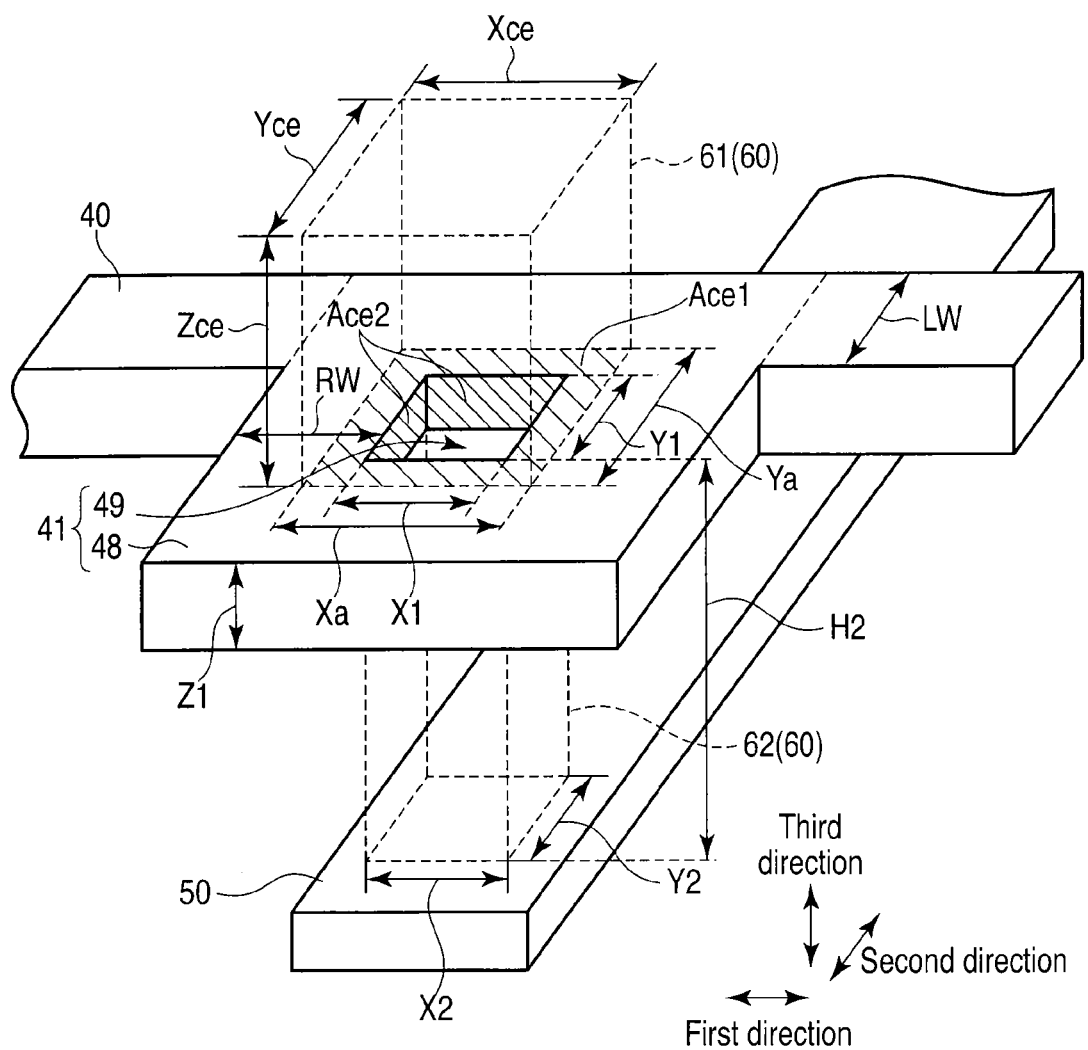
F I G. 10

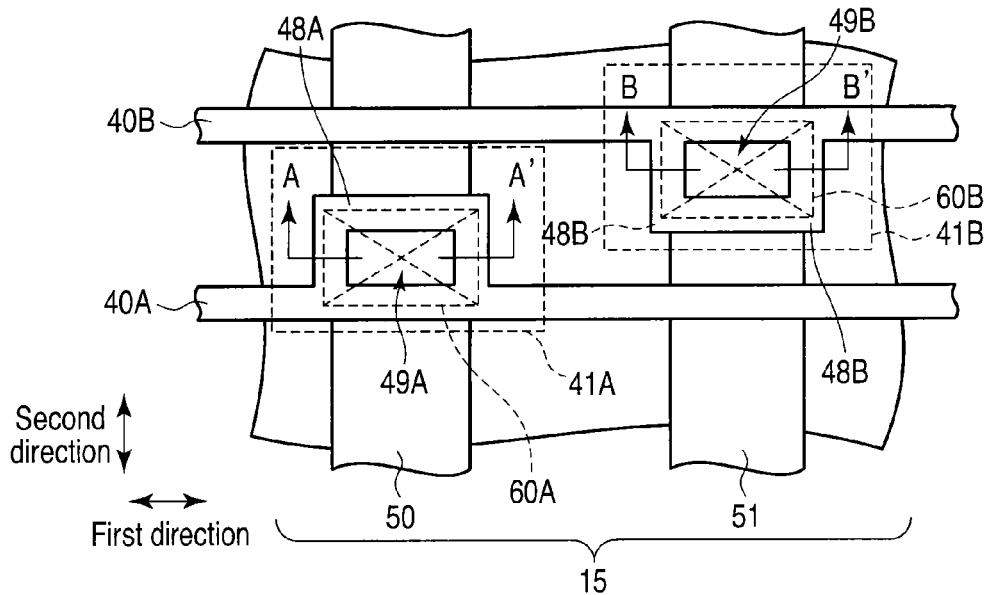
F I G. 12
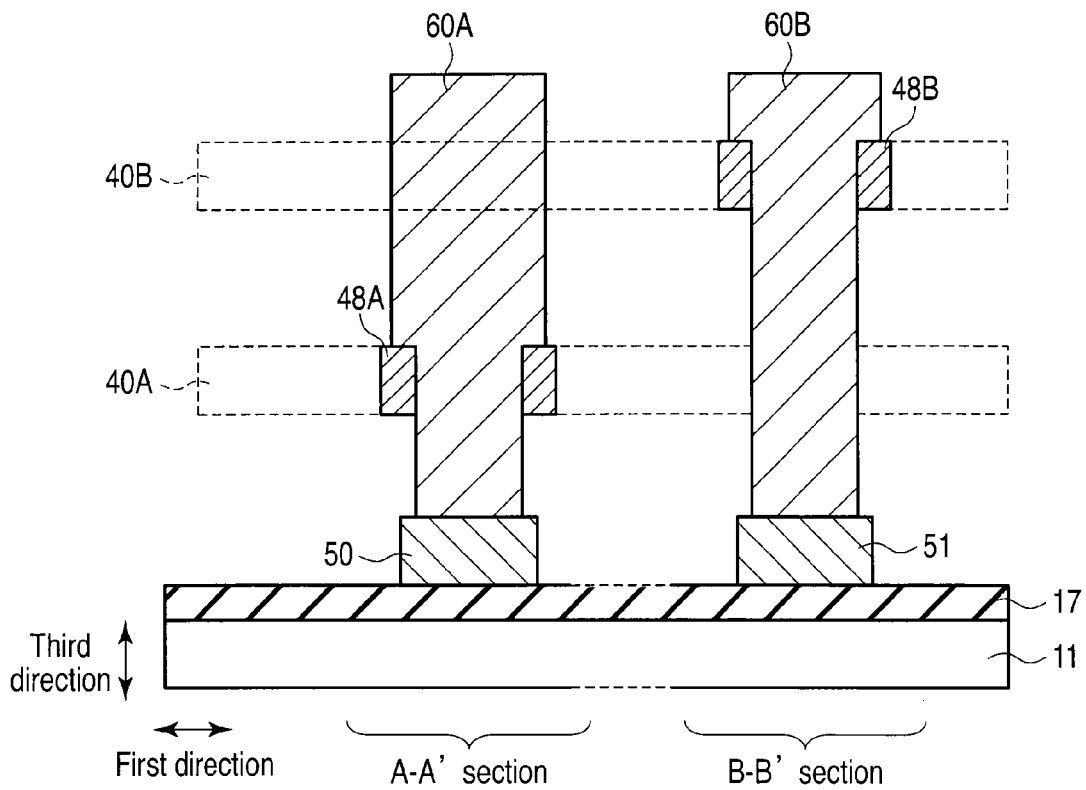
F I G. 13

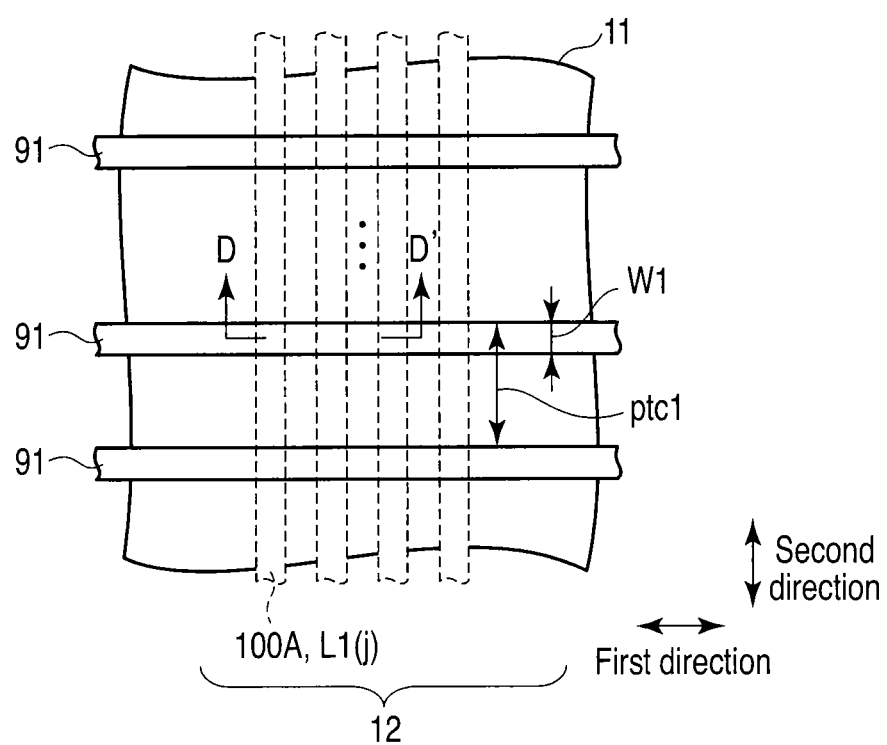
F I G. 14A

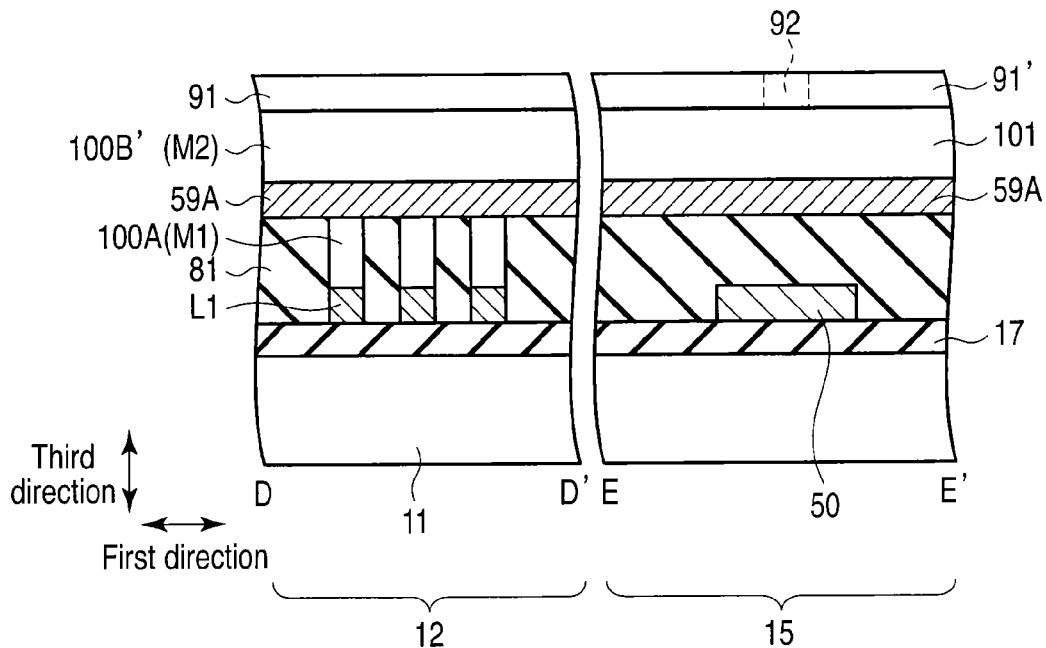
F I G. 14C
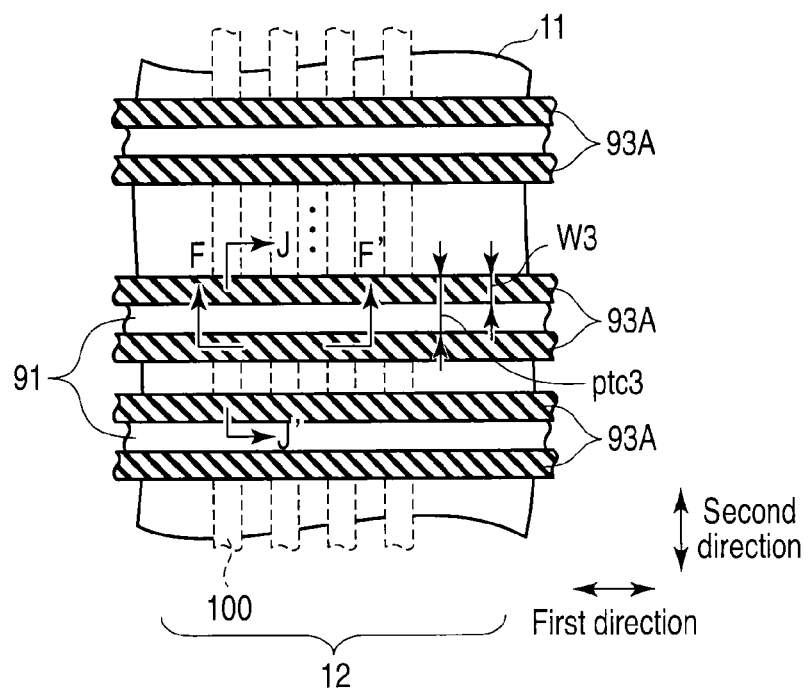
F I G. 15A

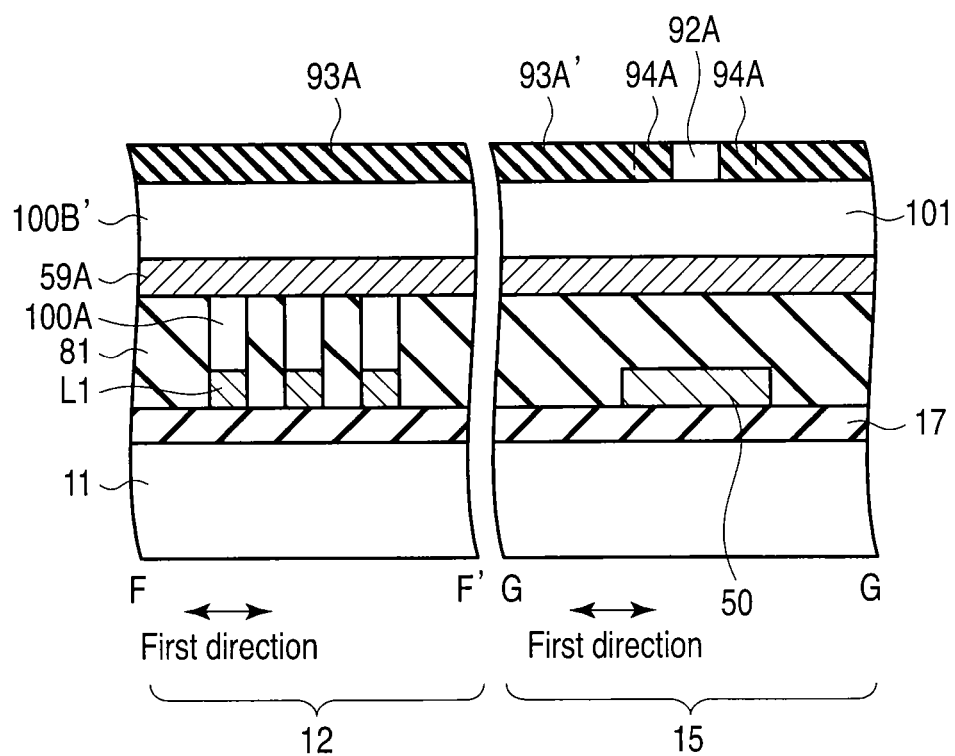
F I G. 15C

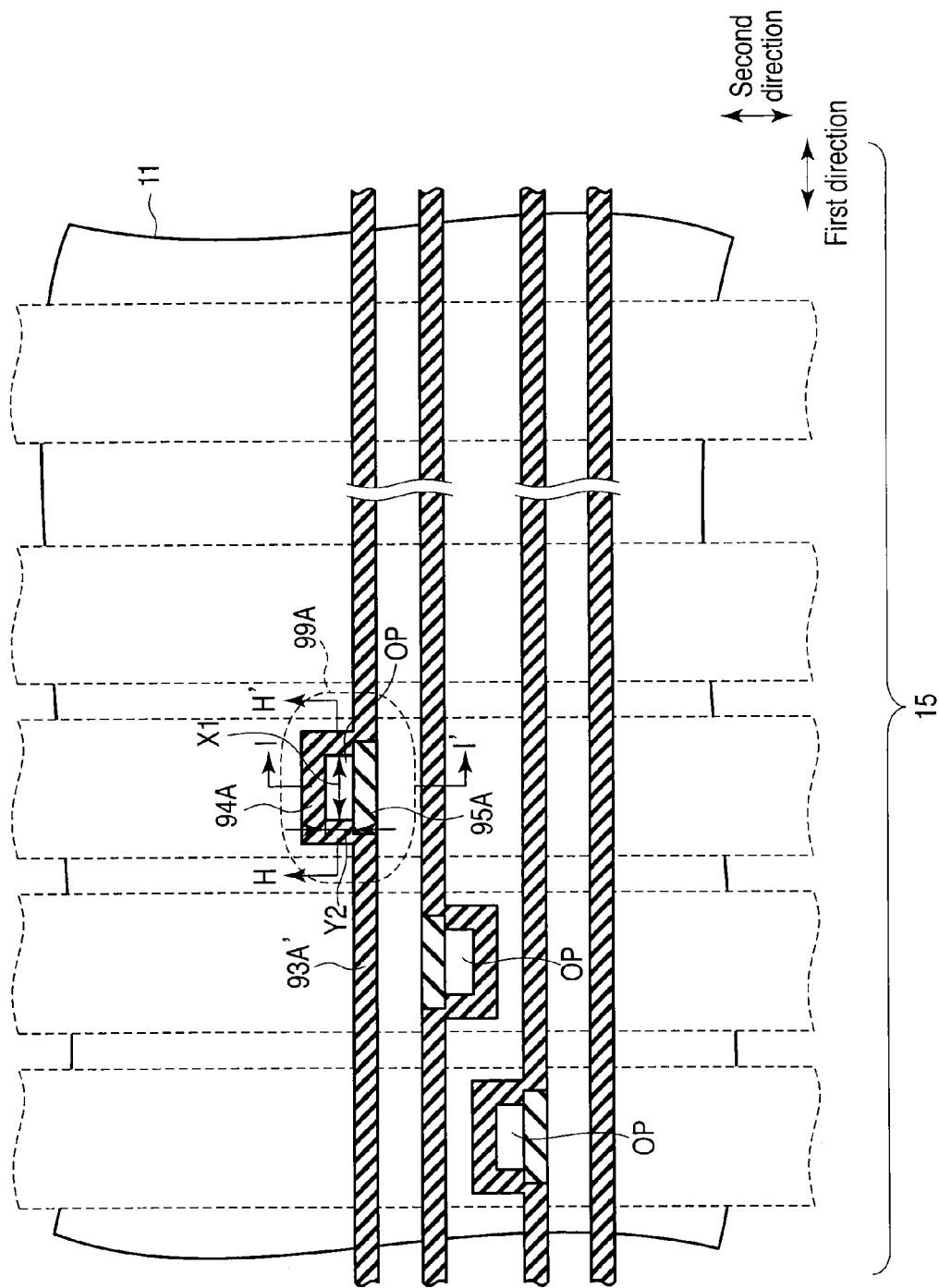
F I G. 16A

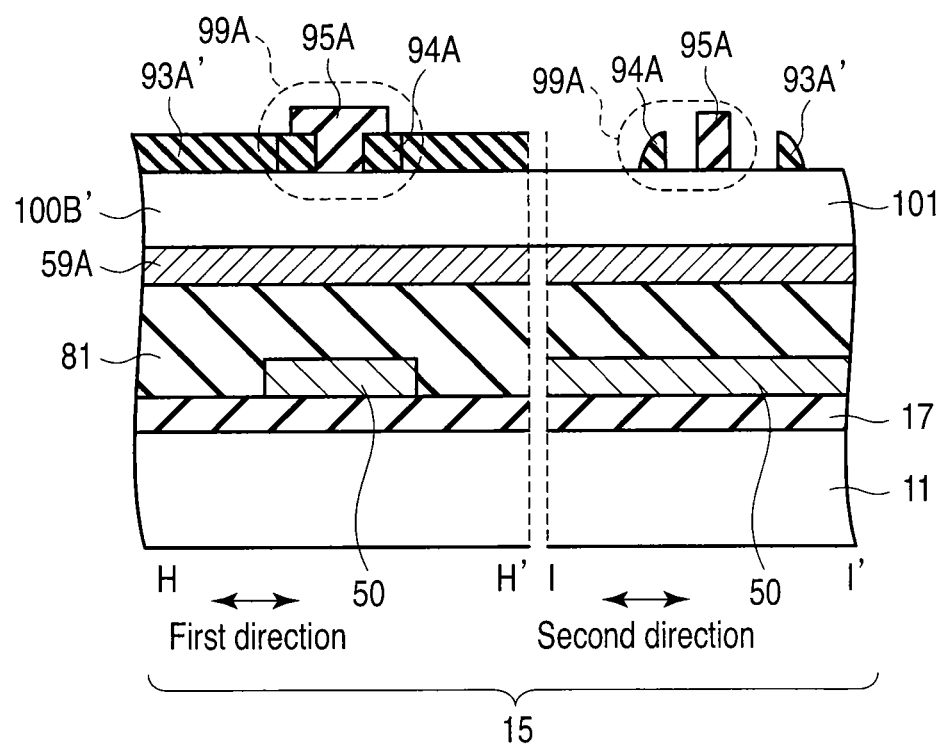
F I G. 16B

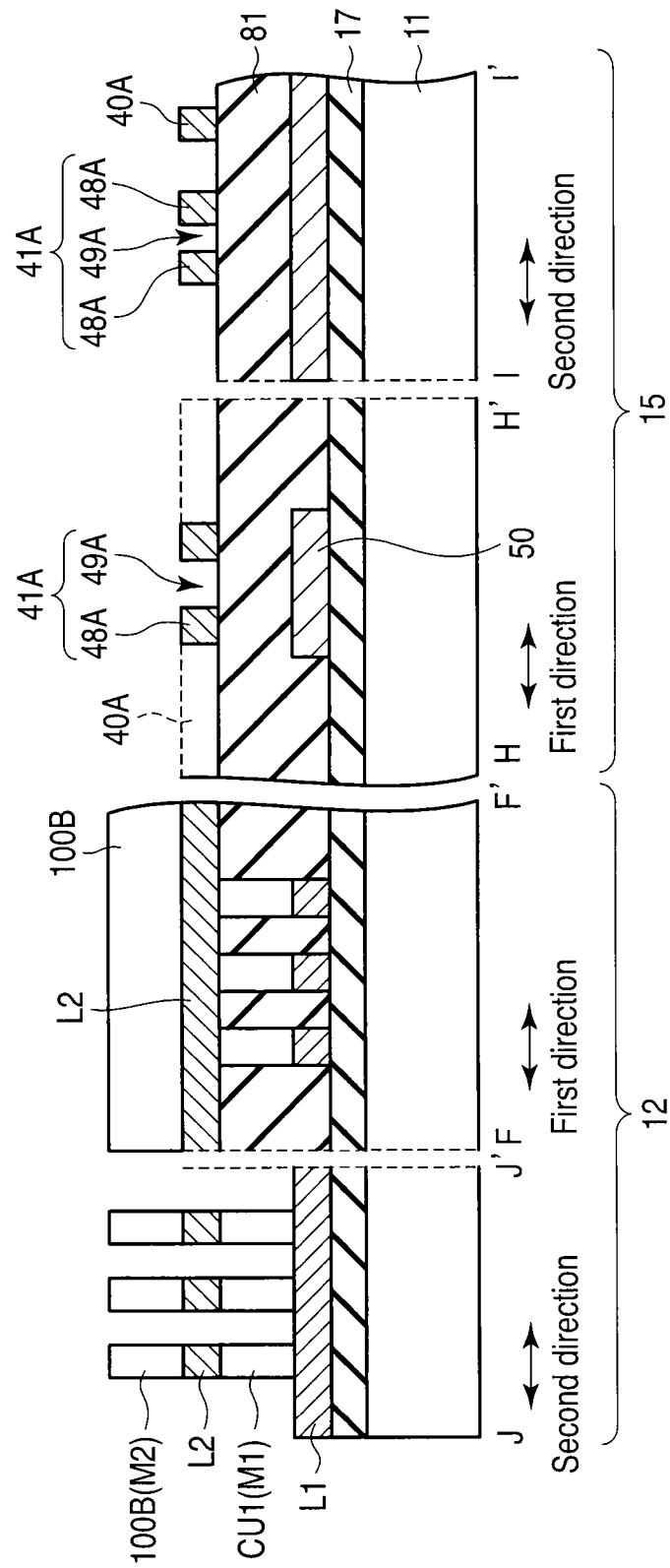
F I G. 17

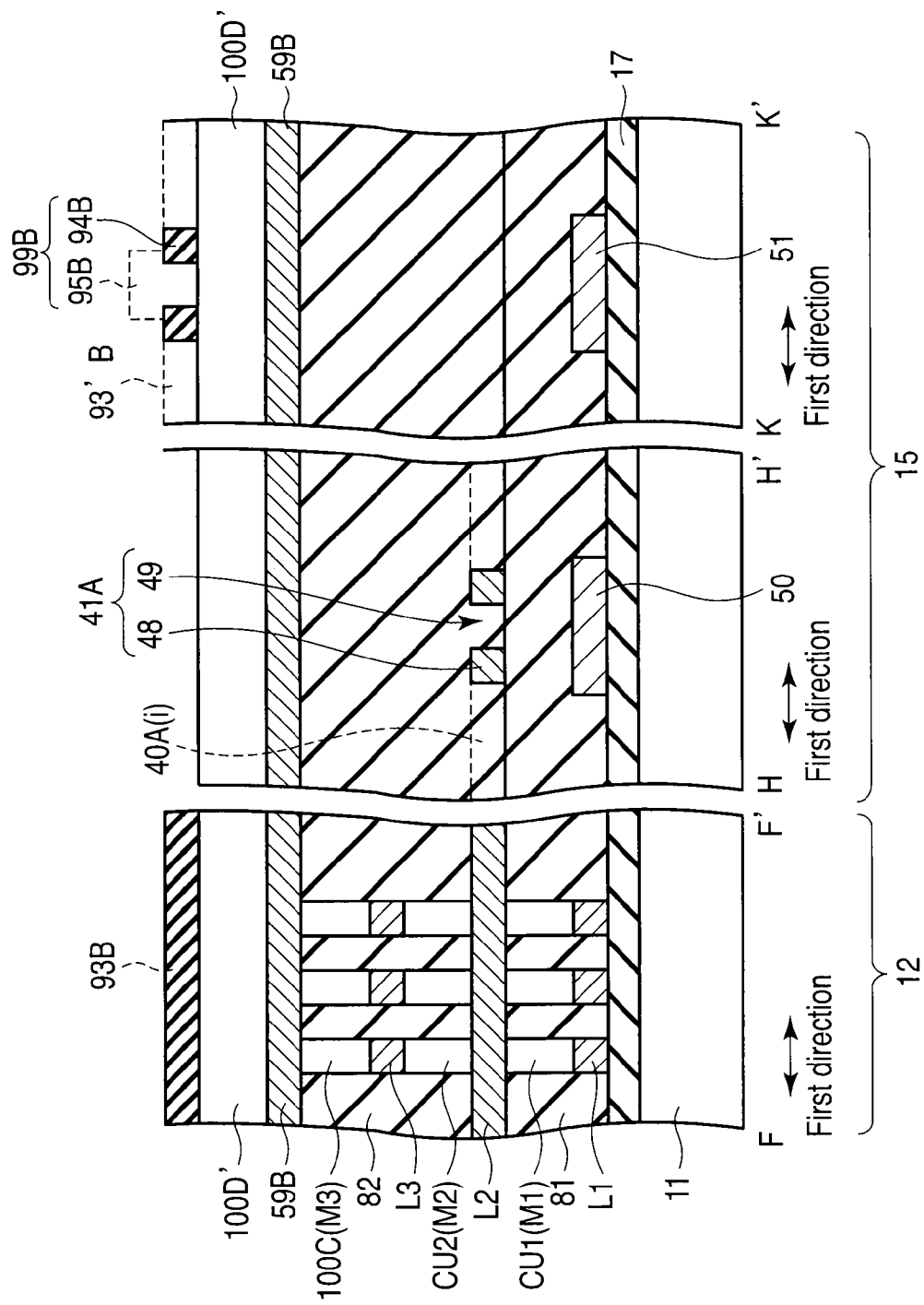
F I G. 18B

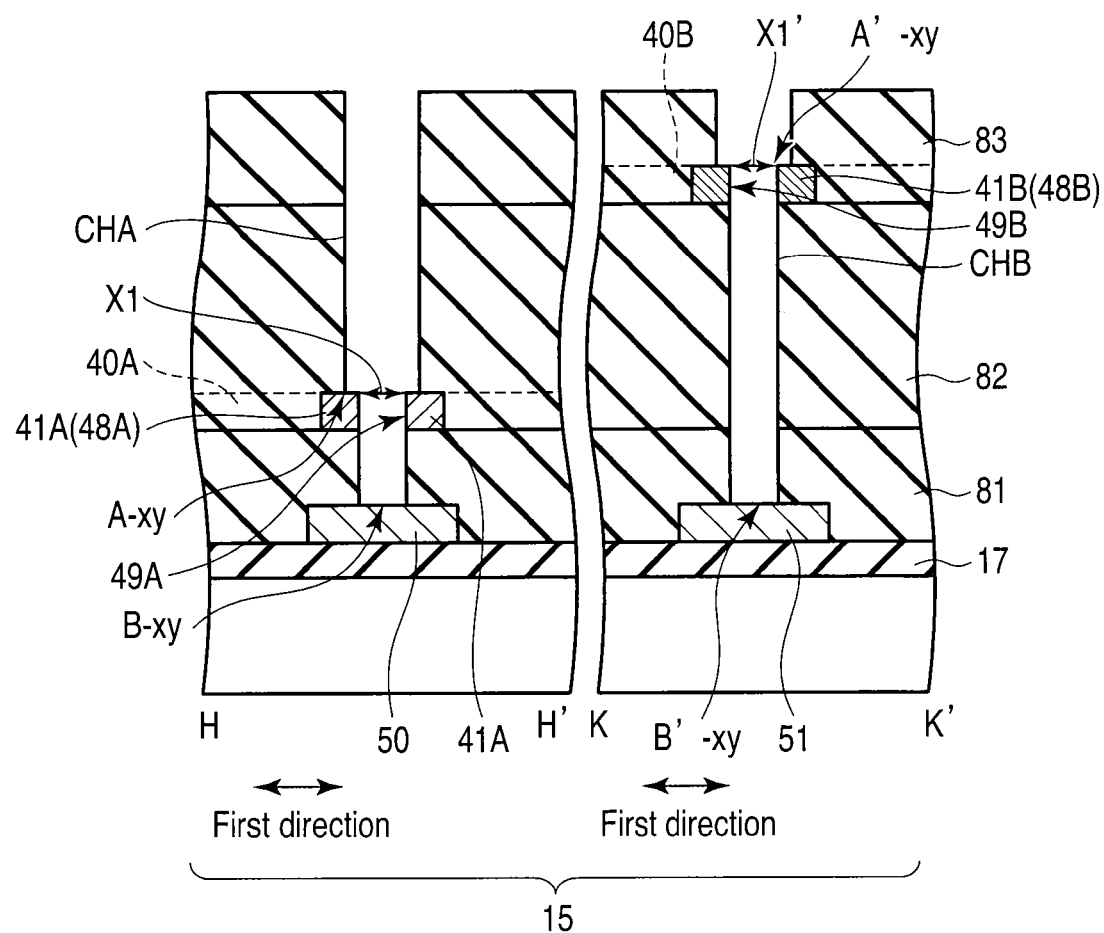
F I G. 19A

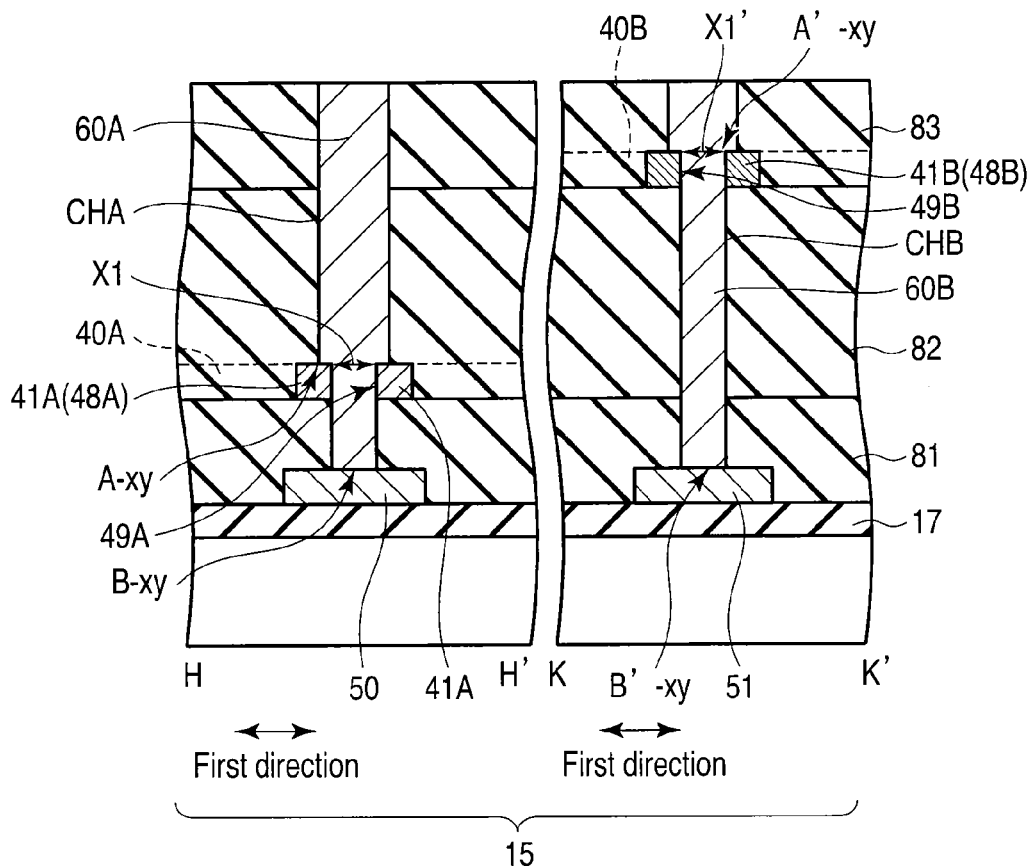
F I G. 19B
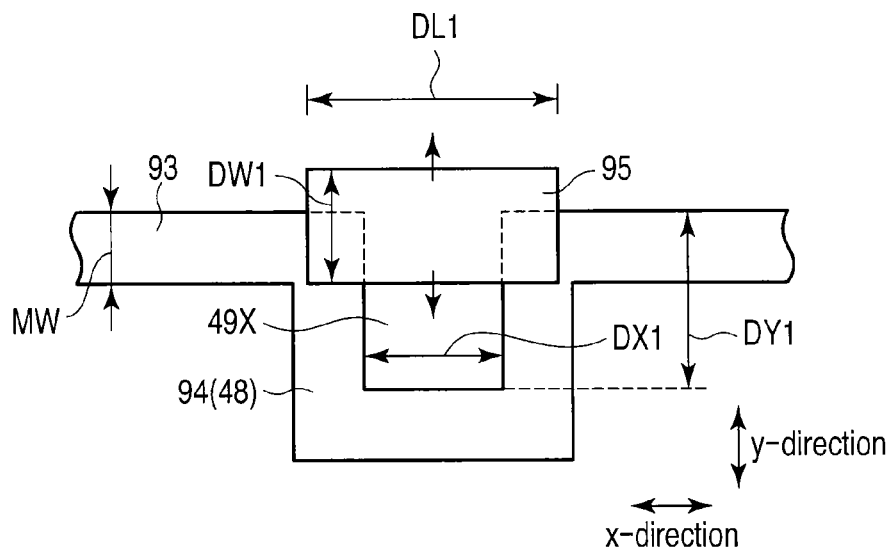
F I G. 20

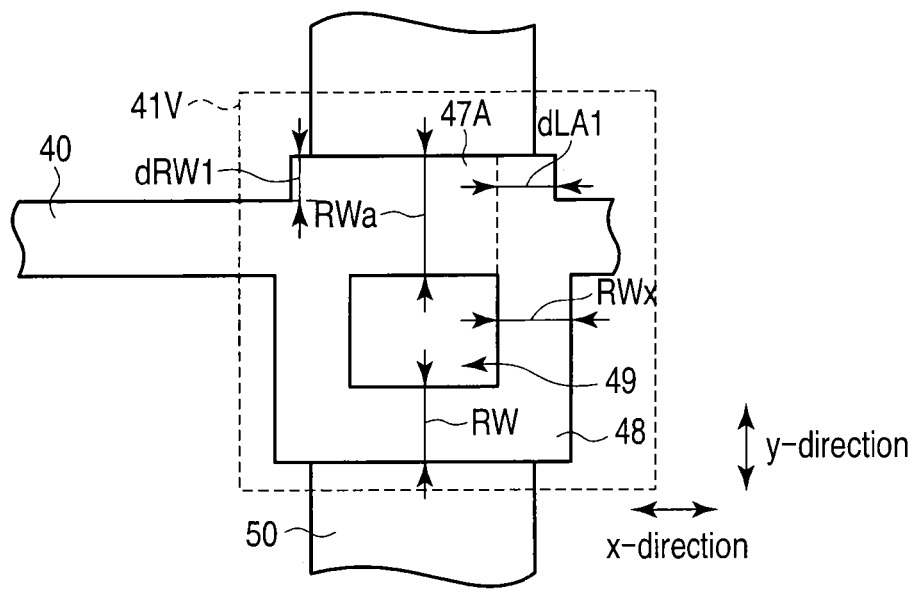
F I G. 21A
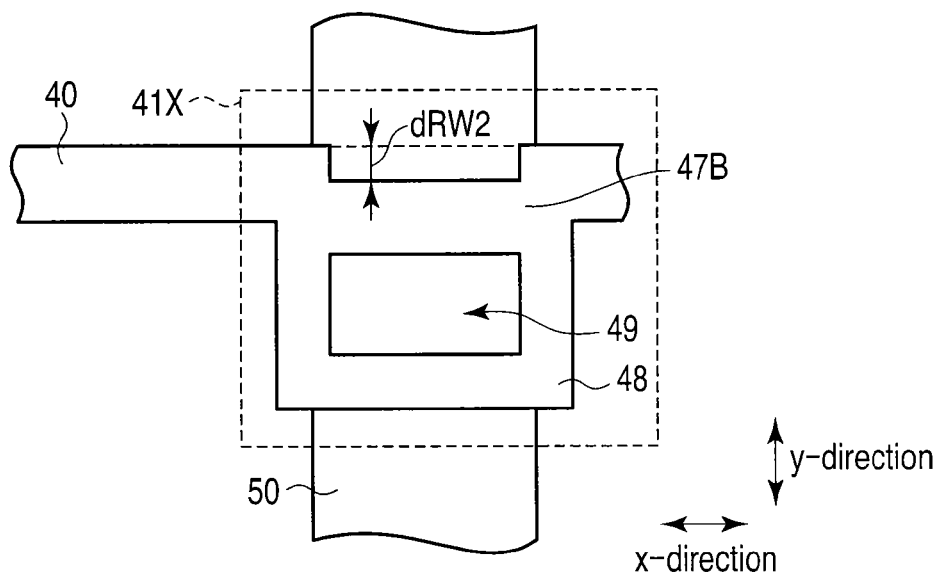
F I G. 21B

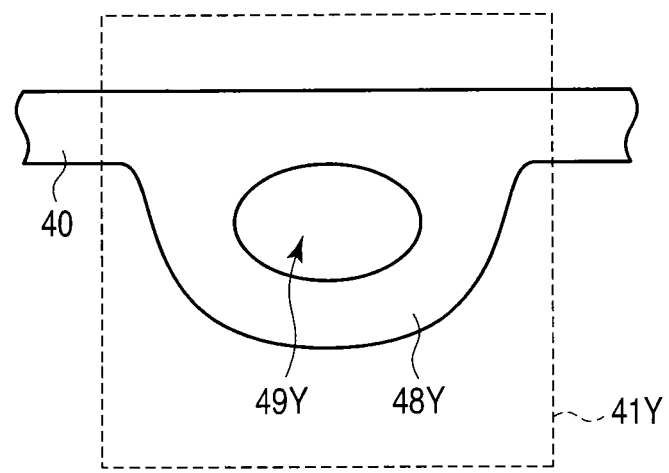
F I G. 22A
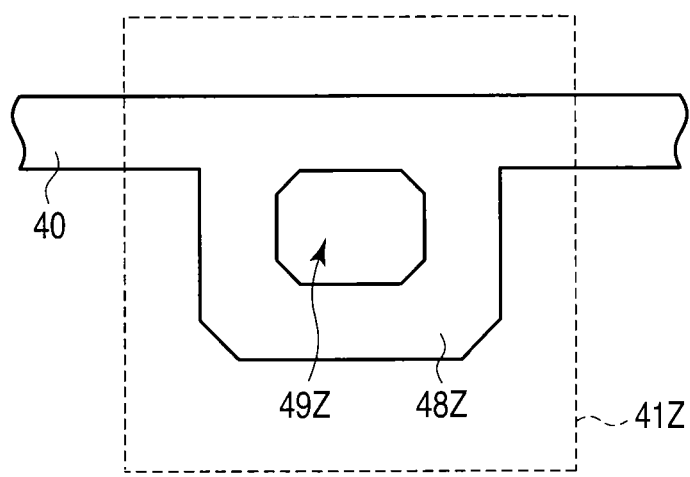
F I G. 22B

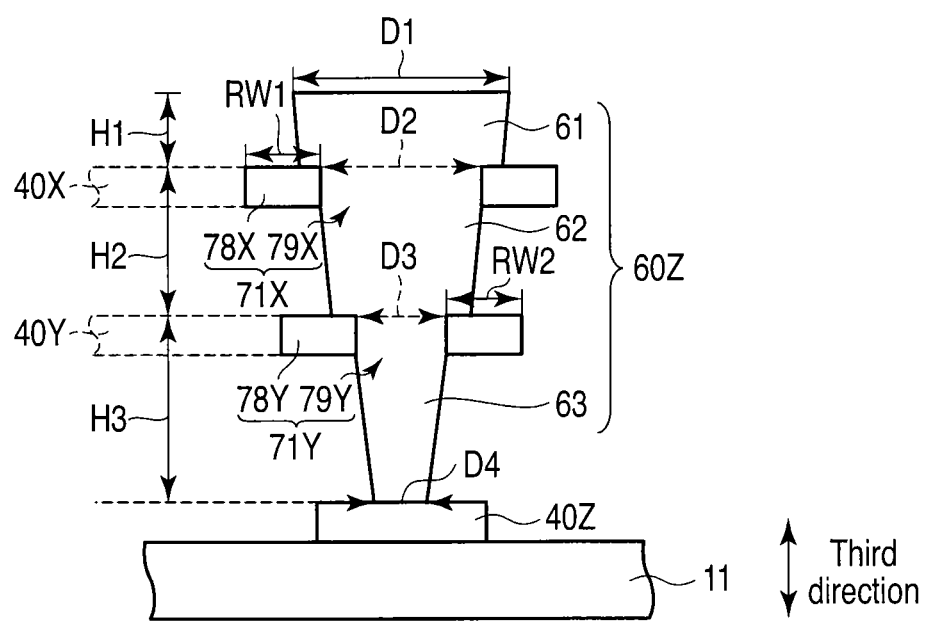
F I G. 23

SEMICONDUCTOR DEVICE

CROSS-REFERENCE TO RELATED APPLICATIONS

This application is a division of and claims the benefit of priority under 35 U.S.C. §120 from U.S. Ser. No. 13/040,018 filed Mar. 3, 2011, and claims the benefit of priority under 35 U.S.C. §119 from Japanese Patent Application No. 2010-113533 filed May 17, 2010; the entire contents of each of which are incorporated herein by reference.

FIELD

Embodiments described herein relate generally to a semiconductor device.

BACKGROUND

A semiconductor memory as a semiconductor device is mounted on various electronic equipment. Recently, resistance change memories such as ReRAM (Resistive RAM) using a variable resistance device as a memory device, PCRAM (Phase Change RAM) using a phase change device as a memory device, and the like have received attention as a next generation non-volatile semiconductor memory.

These resistance change memories have a feature in that a memory cell array is of a cross point type and can realize a large memory capacity by a three-dimensional integration and operation at a high speed similar to a DRAM (refer to, for example, Jpn. PCT National Publication No. 2005-522045).

In the resistance change memory, a cross point type memory cell array includes cell units. Each of the cell units is formed of a memory device and a non-ohmic device. In the cross point type memory cell array, the cell units are disposed two-dimensionally as well as stacked in a vertical direction with respect to a substrate surface.

The resistance change memory having the stacked structure includes a contact electrode for connecting an interconnect having a certain interconnect level and another interconnect having a different interconnect level (an upper layer or a lower layer) (refer to, for example, Jpn. Pat. Appln. KOKAI Publication No. 2009-130140 reference). In the cross point type memory cell array, a contact portion connected to the contact electrode is disposed to a part of the interconnect.

In a semiconductor device such as the resistance change memory, when a connecting state of a contact electrode and an interconnect (contact portion) is deteriorated, a contact resistance of the contact electrode and the interconnect is increased, and electric characteristics of each interconnect are dispersed. Further, when an area for disposing the contact electrode and the contact portion is simply reduced here, the dispersion of the electric characteristics is increased.

BRIEF DESCRIPTION OF THE DRAWINGS

FIG. 2 is a view showing a configuration example of a cross point type memory cell array;
FIG. 5A is view showing a layout of first and second control circuits;
FIG. 6 is view showing a layout of first and second control circuits;
FIG. 7 is view showing a layout in the vicinity of the memory cell array;
FIG. 8 is a plan view showing a basic example of an interconnect and a contact of a semiconductor device of the embodiment;
FIG. 9 is a sectional view showing the basic example of the interconnect and the contact of the semiconductor device of the embodiment;
FIG. 10 is view describing a configuration of the interconnect and the contact of the semiconductor device of the embodiment;
FIG. 12 is view showing a structure example of an interconnect and a contact of a resistance change memory;
FIG. 13 is view showing a structure example of an interconnect and a contact of a resistance change memory;
FIG. 14A is view showing a process of a method of manufacturing the resistance change memory;
FIG. 14C is view showing a process of a method of manufacturing the resistance change memory;
FIG. 15A is view showing a process of a method of manufacturing the resistance change memory;
FIG. 15C is view showing a process of a method of manufacturing the resistance change memory;
FIG. 16A is view showing a process of a method of manufacturing the resistance change memory;
FIG. 16B is view showing a process of a method of manufacturing the resistance change memory;
FIG. 17 is view showing a process of a method of manufacturing the resistance change memory;
FIG. 18B is view showing a process of a method of manufacturing the resistance change memory;
FIG. 19A is view showing a process of a method of manufacturing the resistance change memory;
FIG. 19B is view showing a process of a method of manufacturing the resistance change memory;
FIG. 20 is a view describing a modification of the semiconductor device of the embodiment;
FIG. 21A is a view describing a modification of the semiconductor device of the embodiment;
FIG. 21B is a view describing a modification of the semiconductor device of the embodiment;
FIG. 22A is a view describing a modification of the semiconductor device of the embodiment;
FIG. 22B is a view describing a modification of the semiconductor device of the embodiment;
and
FIG. 23 is a view describing a modification of the semiconductor device of the embodiment.

DETAILED DESCRIPTION

Figure 1:
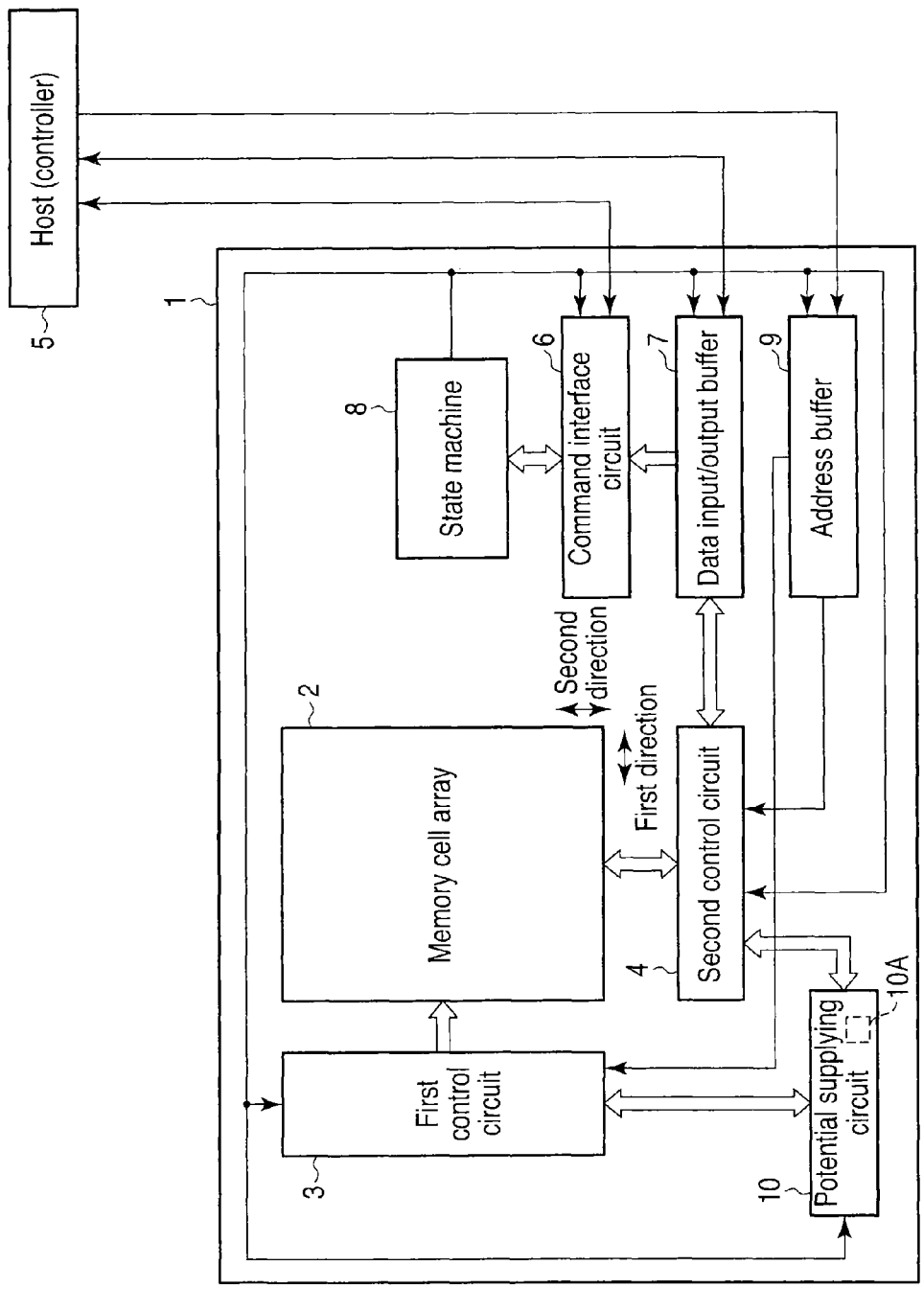
FIG. 1 is view showing a resistance change memory of an example of a semiconductor device of an embodiment of the invention.

A semiconductor device according to an embodiment will be described below in detail referring to the drawings. In the following description, the components having the same functions and the same configurations are denoted by the same reference numerals and will be described in duplication when necessary.

In general, according to one embodiment, a semiconductor device includes a substrate and an interconnect region on the substrate. The interconnect region includes a first interconnect having a first contact portion whose plane shape is a ring-like plane shape, a second interconnect disposed below the first interconnect, and a contact electrode passing through the ling-like portion of the first contact portion and electrically connecting the first interconnect and the second interconnect.

A subject of the embodiment is a resistance change memory as a semiconductor device using, for example, a variable resistance device or a phase change device as a memory device.

[Embodiment]

(1) Basic Example

A semiconductor device according to an embodiment will be described using FIGS. 1, 2, 3, 4, 5, 6, 7, 8, 9, and 10. In the embodiment, a resistance change memory will be described as an example of the semiconductor device.

FIG. 1 shows a main portion of the resistance change memory.

The resistance change memory (for example, chip) 1 includes a cross point type memory cell array 2.

A first control circuit 3 is disposed to an end of the cross point type memory cell array 2 in a first direction, and a second control circuit 4 is disposed to one end in a second direction intersecting the first direction.

The first control circuit 3 selects a row of the cross point type memory cell array 2 based on, for example, a row address signal. Further, the second control circuit 4 selects a column of the cross point type memory cell array 2 based on, for example, a column address signal.

The first and second control circuits 3, 4 control write, erase, and read of data to a memory device in the memory cell array 2.

In the resistance change memory 1 of the embodiment, for example, the write is referred to as a set and the erase is referred to as a reset. It is sufficient that a resistance value of a set state is different from a resistance value of a reset state, and it is not important whether the resistance value of the set state is higher or lower than the resistance value of the reset state.

Further, a multi-level resistance change memory, in which one memory device stores multi-level data, can be also realized by selectively writing one level of levels of resistance values which can be set to the memory device in a set operation.

A controller 5 supplies a control signal and data to the resistance change memory 1. The control signal is input to a command interface circuit 6, and the data is input to a data input/output buffer 7. The controller 5 may be disposed in the chip 1 or may be disposed in a chip (host device) different from the chip 1.

The command interface circuit 6 determines whether or not data from the controller 5 is command data based on the control signal. When the data is the command data, the command interface circuit 6 transfers the data from the data input/output buffer 7 to a state machine 8.

The state machine 8 manages an operation of the resistance change memory 1 based on the command data. For example, the state machine 8 manages a set/reset operation and a read operation based on the command data from the controller 5. It is also possible for the controller 5 to receive status information managed by the state machine 8 and to determine a result of operation in the resistance change memory 1.

In the set/reset operation and the read operation, the controller 5 supplies an address signal to the resistance change memory 1. The address signal is input to the first and second control circuits 3, 4 via an address buffer 9.

A potential supply circuit 10 outputs a voltage pulse or a current pulse necessary for, for example, the set/reset operation and the read operation at a predetermined timing based on a command from the state machine 8. The potential supply circuit 10 includes, for example, a pulse generator 10A and controls the voltage value/current value and the pulse width of a voltage pulse/current pulse output in response to an operation shown by the command data and the control signal.

Hereinafter, circuits other than the cross point type memory cell array 2, which constitutes the resistance change memory (chip), are called peripheral circuits.

FIG. 2 is a bird's eye view showing a structure of the cross point type memory cell array.

The cross point type memory cell array 2 is disposed on a substrate 11. The substrate 11 is a semiconductor substrate (for example, a silicon substrate) or an interlayer insulation film on the semiconductor substrate. Note that when the substrate 11 is the interlayer insulation film, a circuit using a field effect transistor and the like may be formed on the surface of the semiconductor substrate under the cross point type memory cell array 2 as a peripheral circuit of the resistance change memory.

The cross point type memory cell array 2 has a stack structure of, for example, memory cell arrays (also called memory cell layers).

FIG. 2 shows, as an example, a case in which the cross point type memory cell array 2 has four memory cell arrays, M1, M2, M3 and M4, stacked in a third direction (direction vertical to a main plane of the substrate 11). It is sufficient that at least two memory cell arrays are stacked. Note that the cross point type memory cell array 2 may have one memory cell array. Further, an insulation film may be disposed between two stacked memory cell arrays and the two memory cell arrays may be electrically separated by the insulation film.

As shown in FIG. 2, when the memory cell arrays M1, M2, M3 and M4 are stacked, the address signal includes, for example, a memory cell array selection signal, a row address signal, and a column address signal. The first and second control circuits 3, 4 select one of the stacked memory cell arrays based on, for example, the memory cell array selection signal. The first and second control circuits 3, 4 can write, erase, and read data to one of the stacked memory cell arrays or can also write, erase, and read data to at least two or all of the stacked memory cell arrays at the same time.

The memory cell array M1 includes cell units CU1 disposed in first and second directions in an array state. Likewise, the memory cell array M2 includes cell units CU2 disposed in the array state, the memory cell array M3 includes cell units CU3 disposed in the array state, and the memory cell array M4 includes cell units CU4 disposed in the array state.

Further, control lines L1 (j−1), L1 (j), L1 (j+1), control lines L2 (i−1), L2 (i), L2 (i+1), control lines L3 (j−1), L3 (j), L3 (j+1), control lines L4 (i−1), L4 (i), L4 (i+1), and control lines L5 (j−1), L5 (j), L5 (j+1) are sequentially disposed on the substrate 11 from the substrate 11 side.

Odd numbers of interconnects from the substrate 11 side, that is, the control lines L1 (j−1), L1 (j), L1 (j+1), the control lines L3 (j−1), L3 (j), L3 (j+1), and the control lines L5 (j−1), L5 (j), L5 (j+1) extend in the second direction.

Even numbers of interconnects from the semiconductor substrate 11 side, that is, the control lines L2 (i−1), L2 (i), L2 (i+1), and the control lines L4 (i−1), L4 (i), L4 (i+1) extend in the first direction intersecting the second direction.

The control lines are used as word lines or bit lines.

The first memory cell array M1 of a lowermost layer is disposed between the first control lines L1 (j−1), L1 (j), L1 (j+1) and the second control line L2 (i−1), L2 (i), L2 (i+1). In the set/reset operation and the read operation of the memory cell array M1, one control lines of the control lines L1 (j−1), L1 (j), L1 (j+1) or the control lines L2 (i−1), L2 (i), L2 (+1) are used as the word lines, and the other control lines are used as the bit lines.

The memory cell array M2 is disposed between the second control lines L2 (i−1), L2 (i), L2 (i+1) and the third control line L3 (j−1), L3 (j), L3 (j+1). In the set/reset operation and the read operation of the memory cell array M2, one control lines of the control lines L2 (i−1), L2 (i), L2 (i+1) or the control lines L3 (j−1), L3 (j), L3 (j+1) are used as the word lines, and the other control lines are used as the bit lines.

The memory cell array M3 is disposed between the third control lines L3 (j−1), L3 (j), L3 (j+1) and the fourth control lines L4 (i−1), L4 (i), L4 (i+1). In the set/reset operation and the read operation of the memory cell array M3, one control lines of the control lines L3 (j−1), L3 (j), L3 (j+1) or the control lines L4 (i−1), L4 (i), L4 (i+1) are used as the word lines, and the other control lines are used as the bit lines.

The memory cell array M4 is disposed between the fourth control lines L4 (i−1), L4 (i), L4 (i+1) and the fifth control lines L5 (j−1), L5 (j), L5 (j+1). In the set/reset operation and the read operation of the memory cell array M4, one control lines of the control lines L4 (i−1), L4 (i), L4 (i+1) or the control lines L5 (j−1), L5 (j), L5 (j+1) are used as the word lines, and the other control lines are used as the bit lines.

The cell units CU1 are disposed to the portions where the control lines L1 (j−1), L1 (j), L1 (j+1) intersect the control lines L2 (i−1), L2 (i), L2 (i+1). Likewise, the cell units CU2, CU3, CU4 are disposed respectively to the portions where the control lines L2 (i−1), L2 (i), L2 (i+1) intersect the control lines L3 (j−1), L3 (j), L3 (j+1), the portions where the control lines L3 (j−1), L3 (j), L3 (j+1) intersect the control lines L4 (i−1), L4 (i), L4 (i+1 ), and the portions where the control lines L4 (i−1), L4 (i), L4 (i+1) intersect the control lines L5 (j−1), L5 (j), L5 (j+1). More specifically, in the cross point type memory cell array 2, the cell units are disposed to the portions where the control lines, which are continuously stacked in the third direction, intersect.

Note that, when the stacked memory cell arrays are separated to respective layers by insulation films, the control lines extending in the first and second directions are not shared by the two stacked memory cell arrays, and control lines as the word lines and as the bit lines are disposed to the memory cell arrays of the respective layers.

Figure 3A:
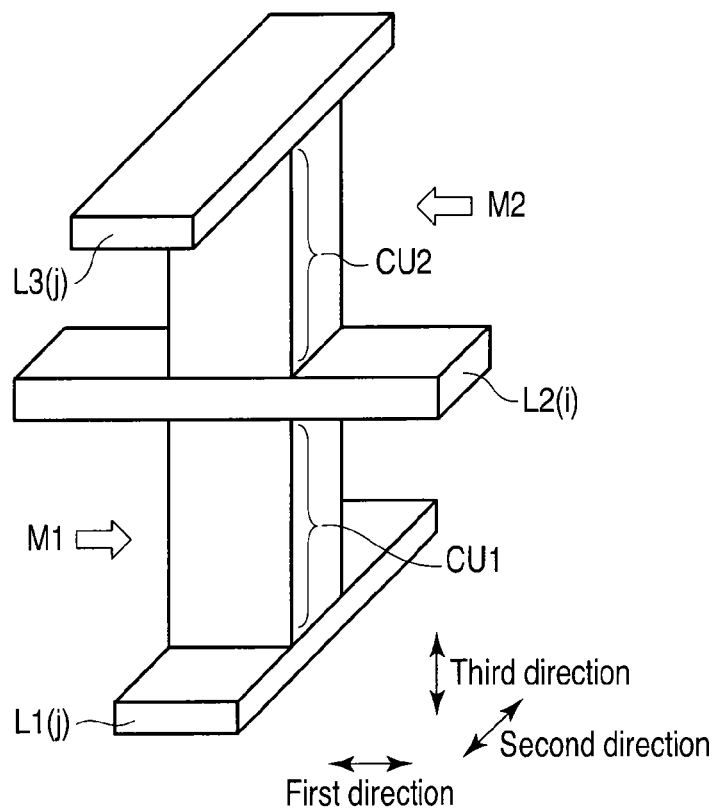
FIG. 3A is view showing a configuration example of a cell unit of the memory cell array of FIG. 2.
Figure 3B:
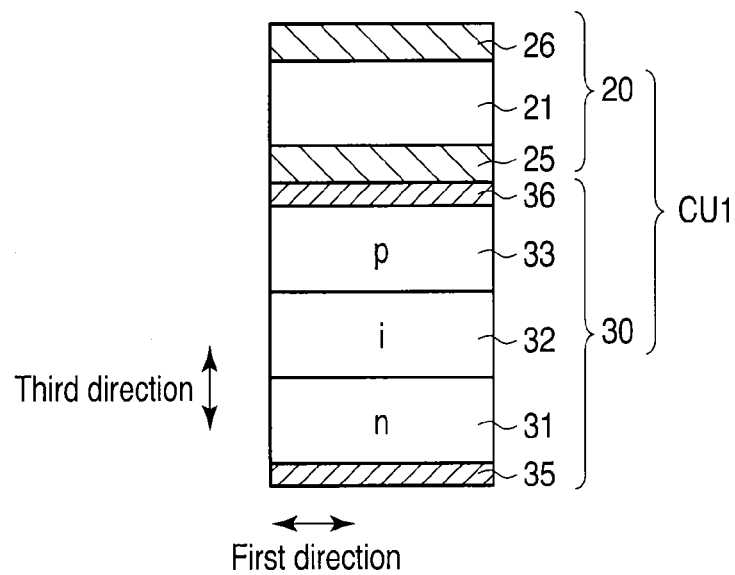
FIG. 3B is view showing an example of the cell unit.

FIG. 3A shows an example of a structure of interconnects and cell units in the cross point type memory cell array. FIG. 3B shows an example of a more specific structure of one cell unit.

FIG. 3A shows the cell units CU1, CU2 in the two memory cell arrays M1, M2 in FIG. 2. The configuration of the cell units in the two memory cell arrays M3, M4 in FIG. 2 are the same as the configuration of the cell units in the two memory cell arrays M1, M2 in FIG. 2.

The stacked cell units CU1, CU2 share the one control line L2 (i).

One end of a current path of the cell unit CU1 is connected to the control line L1 (j), and the other end of the current path of the cell unit CU1 is connected to the control line L2 (i). One end of a current path of the cell unit CU2 is connected to the control line L2 (i), and the other end of the current path of the cell unit CU2 is connected to the control line L3 (j).

Each of the cell units CU1, CU2 includes a memory device and a non-ohmic device. The memory device is connected in series to the non-ohmic device. For example, a rectifier device is used for the non-ohmic device.

Various patterns exist as a connection relation between the memory device and the rectifier device as the non-ohmic device. However, it is necessary that all the cell units in one memory cell array have the same connection relation between the memory device and the rectifier device.

Figure 4:
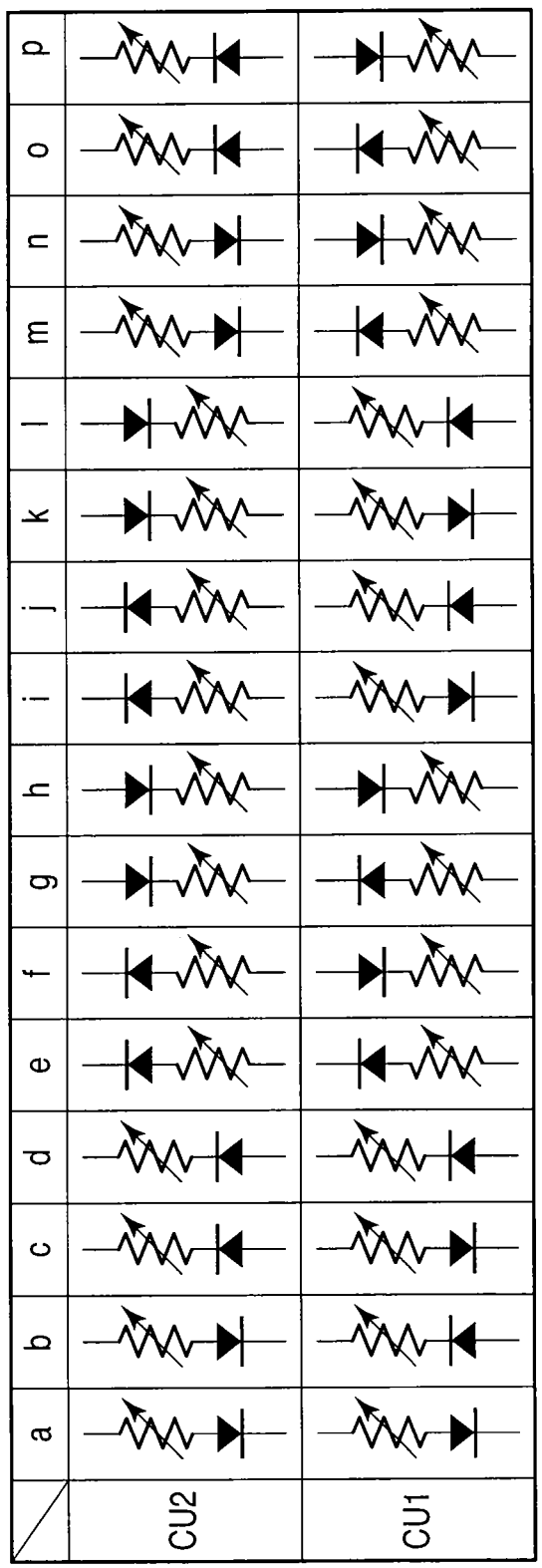
FIG. 4 is view showing a connection relation between a memory device and a rectifier device.

FIG. 4 shows the connection relation between the memory device and the rectifier device.

As to the connection relation between the memory device and the rectifier device in one cell unit, there exist two different ways of a positional relation between the memory device and the rectifier device and two different ways of the direction of the rectifier, that is, there exist four different ways of the connection relation in total. Accordingly, as to the cell units in the two memory cell arrays, there exist 16 different ways (four different ways×four different ways) of patterns of the connection relation between the memory device and the rectifier device. In FIG. 4, "a" to "p" show the 16 different ways of the connection relation. The embodiment can be applied to all the 16 different ways of the connection relation.

FIG. 3B shows a structure example of the cell unit CU1 shown in "a" of FIG. 4.

In the cell unit CU1 of the embodiment of FIG. 3B, a memory device 20 is stacked on a non-ohmic device 30. A stacked body including the memory device 20 and the non-ohmic device 30 is sandwiched between the two control lines L2 (i), L3 (j) as one cell unit CU. However, the structure of the cell unit CU shown in FIG. 3A is an example, and the non-ohmic device 30 may be stacked on the memory device 20 in response to a connection relation between the cell unit shown in FIG. 4.

The memory device 20 is a variable resistance device or a phase change device. Here, the variable resistance device is a device including a material whose resistance value is changed by an application of energy such as a voltage, a current, and heat. Further, the phase change device is a device including a material in which a crystal phase of the device is changed by the energy applied thereto and a physical property (impedance) such as a resistance value and a capacitance is changed by the phase change.

Such phase change (phase transition) includes the ones shown below.

- Metal-semiconductor transition, metal-insulator transition, metal-metal transition, insulator-insulator transition, insulator-semiconductor transition, insulator-metal transition, semiconductor-semiconductor transition, semiconductor-metal transition, semiconductor-insulator transition
- Phase change (metal-superconductor transition and the like) in quantum state
- Paramagnetic-ferromagnetic transition, antiferromagnetic-ferromagnetic transition, ferromagnetic-ferromagnetic transition, ferrimagnetic-ferromagnetic transition, and transitions composed of these transitions
- Paraelectric-ferroelectric transition, paraelectric-pyroelectric transition, paraelectric-piezoelectric transition, ferroelectric-ferroelectric transition, antiferroelectric-ferroelectric transition, and transitions composed of these transitions
- Transitions composed of a combination of these transitions For example, transition from metal, insulator, semiconductor, ferroelectric, paraelectric, pyroelectric, piezoelectric, ferromagnetic, ferrimagnetic, spiral magnetic body, paramagnetic, or antiferromagnetic to a ferroelectric ferromagnetic material and transition opposite to the above transition.

According to the definition, the variable resistance device includes the phase change device.

In the embodiment, the variable resistance device is mainly composed of metal oxides (for example, binary or ternary metal oxides and the like), metal compounds, chalcogenide materials (for example, Ge—Sb—Te, In—Sb—Te, and the like), organic substances, carbon, carbon nanotubes, and the like.

Note that the resistance value of a magneto-resistive effect element used for an MRAM (Magnetoresistive RAM) is also changed by changing a relative direction of magnetization of two magnetic layers of the device. In the embodiment, a magneto-resistive effect element, for example, MTJ (Magnetic Tunnel Junction) device is also included in the variable resistance device.

An operation called a bipolar operation and an operation called a unipolar operation exist as a method of changing the resistance value of the memory device 20.

The bipolar operation reversibly changes the resistance value of the memory device 20 between at least a first value (first level) and a second value (second level) by changing the polarity of a voltage applied to the memory device 20. The bipolar operation is employed to a memory in which it is necessary to flow a current for a memory device in a dual direction in a write operation as in, for example, a spin transfer type MRAM and the like.

The unipolar operation reversibly changes a resistance value of a memory device between at least a first value and a second value by controlling the magnitude of a voltage and/or the application time (pulse width) of the voltage without changing the polarity of the voltage applied to the memory device.

The memory device 20 includes electrode layers 25, 26 at one end and the other end in the third direction (stacked direction). The electrode layer 25 is disposed at a bottom portion of the memory device 20, and the electrode layer 26 is disposed at an upper portion of the memory device 20. The electrode layers 25, 26 are used as, for example, electrodes of the memory device. For example, a metal film, a metal compound film, a conductive semiconductor film, or a stacked film of such is used as the electrode layers 25, 26.

In the embodiment, a portion sandwiched between the two electrode layers 25, 26 is referred to as a resistance change film 21. The resistance change film 21 is a film formed of a material whose resistance value or crystal phase is changed by energy such as a voltage, a current, and heat. The resistance change film 21 includes a material having a property such that a resistance value or a crystal phase of the film itself changes due to the energy applied thereto.

In contrast, the resistance change film 21 may be composed of a material having a property such that the resistance value (or the crystal phase) is changed by changing the interface characteristics between the resistance change film 21 and the electrode layers 25, 26 by the energy applied to the material. In the case, the property for changing the resistance value of the memory device 20 is stably obtained by a combination of a material used for the resistance change film 21 and a material used for the electrode layers 25, 26.

The electrode layers 25, 26 may have a function as diffusion prevention layers. The diffusion prevention layers prevent impurities caused by the lower device 30 and the control lines from dispersing to the memory device 20 or prevent impurities caused by the memory device 20 from dispersing to the lower device and the control lines.

Further, the electrode layers 25, 26 may have a function as adhesion layers for preventing the memory device 20 from exfoliating the lower device 30 and the control lines.

The non-ohmic device 30 is a device whose input/output characteristics (voltage-current characteristics) do not have linearity, that is, a device whose input/output characteristics have non-ohmic characteristics.

The non-ohmic device 30 includes conductive layers 35, 36 at one end and the other end in the third direction (stacked direction). The conductive layer 35 is disposed at a bottom portion of the non-ohmic device 30, and the conductive layer 36 is disposed at an upper portion of the non-ohmic device 30.

The conductive layers 35, 36 are used as electrodes of, for example, the non-ohmic device. The conductive layers 35, 36 include any one of silicide, metal, a metal compound, a conductive semiconductor, and the like. Further, the conductive layers 35, 36 may be stacked bodies of these materials. Hereinafter, the conductive layers 35, 36 for which silicide is used will be particularly referred to as silicide layers 35, 36.

FIG. 3B exemplifies a PIN diode as the non-ohmic device. The PIN diode is a diode having an intrinsic semiconductor layer between a P-type semiconductor layer (anode layer) and an N-type semiconductor layer (cathode layer). In the structure shown in FIG. 3, a layer 32 sandwiched between two layer 31, 33 is the intrinsic semiconductor layer, one of the two layers 31, 33, that is, the layer 33 is the P-type semiconductor layer, and the other remaining layer 31 is the N-type semiconductor layer. Note that the intrinsic semiconductor layer includes not only a case in which it does not contain N-type or P-type impurities at all but also a case in which it has an impurity concentration lower than the impurity concentrations of the N-type and P-type semiconductor layers.

The non-ohmic device is not limited to the PIN diode shown in FIG. 3B, and the PN diode, a MIS diode, a SIS structure, a MIM structure, and the like may be appropriately used in response to an operation required by the cell unit.

The PN diode is a diode in which a P-type semiconductor layer (anode layer) and an N-type semiconductor layer (cathode layer) form a PN junction. The MIS (Metal-Insulator-Semiconductor) diode is a diode having an insulation layer between a metal layer and a semiconductor layer. The MIM (Metal-Insulator-Metal) structure and the SIS (Semiconductor-Insulator-Semiconductor) structure are devices having a structure in which an insulation layer is sandwiched between two layers composed of a metal layer or a semiconductor layer.

In the resistance change memory driven by the unipolar operation, a rectifier device such as a diode is mainly used as the non-ohmic device 30. In the resistance change memory driven by the bipolar operation, the MIM structure and the SIS structure are mainly used as the non-ohmic device 30.

In the embodiment, the resistance change memory using the unipolar operation will be described. However, it is needless to say that the resistance change memory of the embodiment may be the memory using the bipolar operation.

Figure 5B:
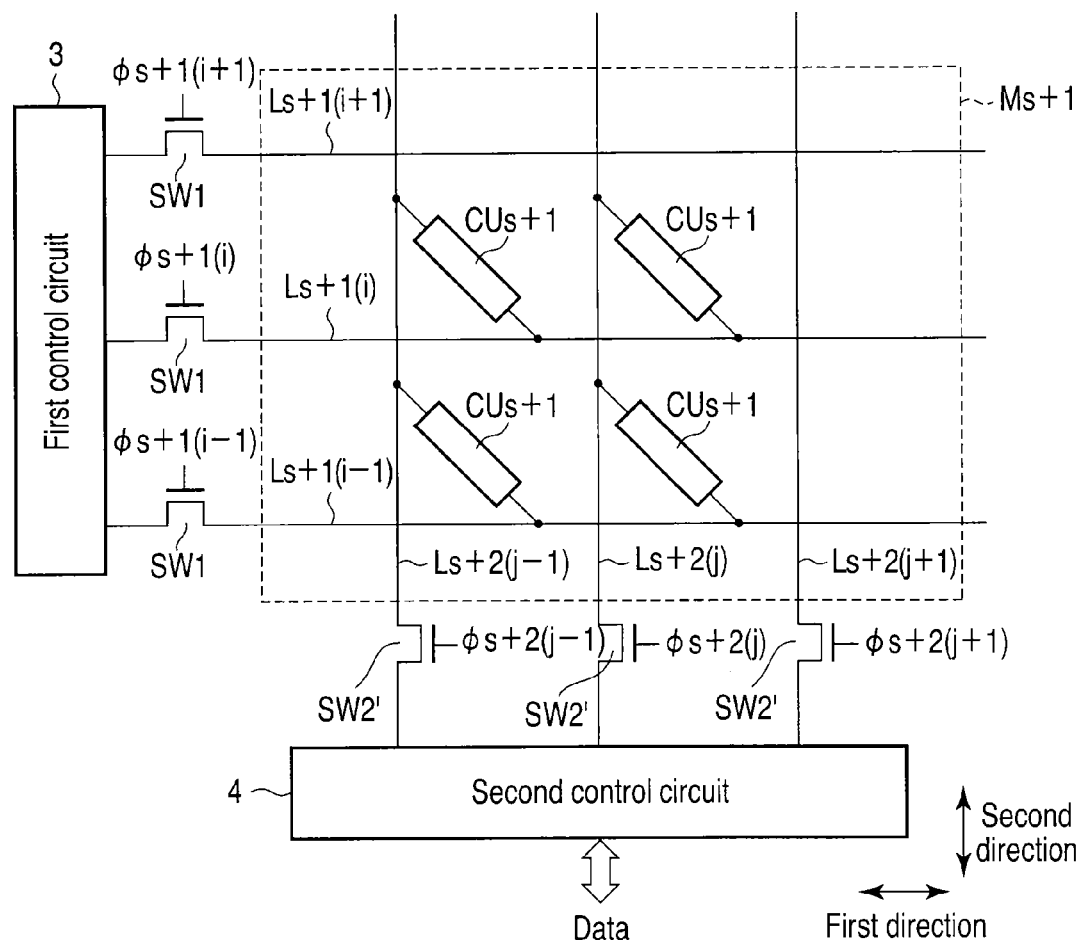
FIG. 5B is view showing a layout of first and second control circuits.

FIGS. 5A and 5B show a first example of a layout of first and second control circuits.

A memory cell array Ms of FIG. 5A corresponds to any one layer of the memory cell arrays M1, M2, M3 and M4 shown in FIG. 2. As shown in FIG. 5A, the memory cell array Ms includes cell units CUs disposed in an array state. One end of each of the cell units CUs is connected to control lines Ls(j−1), Ls(j), Ls(j+1), and the other end of each of the cell units CUs is connected to control lines Ls+1 (i−1), Ls+1 (i), Ls+1 (i+1).

As shown in FIG. 5B, a memory cell array Ms+1 includes cell units CUs+1 disposed in the array state. One end of each of the cell units CUs+1 is connected to control lines Ls+1 (i−1), Ls+1 (i), Ls+1 (i+1), and the other end of each of the cell units is connected to control lines Ls+2 (j−1), Ls+2 (j), Ls+2 (j+1).

However, in FIG. 5A and FIG. 5B, "s" is set to 1, 3, 5, 7, . . . .

A first control circuit 3 is connected to one end of each of the control lines Ls+1 (i−1), Ls+1 (i), Ls+1 (i+1) in a first direction via switch devices SW1. The switch devices SW1 are controlled by, for example, control signals φs+1 (i−1), φs+1 (i), φs+1 (i+1). The switch devices SW1 are formed of, for example, an N channel type field effect transistor (FET).

A second control circuit 4 is connected to one end of each of the control lines Ls(j−1), Ls(j), Ls(j+1) in a second direction via switch devices SW2. The switch devices SW2 are controlled by, for example, control signals φs(j−1), φs(j), φs(j+1). The switch devices SW2 are formed of, for example, an N channel type FET.

The second control circuit 4 is connected to one end of each of control lines Ls+2(j−1), Ls+2 (j), Ls+2(j+1) in the second direction via switch devices SW2 '. The switch devices SW2 ' are controlled by, for example, control signals φs+2 (j−1), φs+2 (j), φs+2 (j+1). The switch devices SW2 ' are formed of, for example, an N channel type FET.

FIG. 6 shows a second example of the layout of the first and second control circuits. Note that, in FIG. 6, since the internal configuration of memory cell arrays Ms, Ms+1, Ms+2, Ms+3 is substantially the same as the memory cell arrays shown in FIG. 5A or FIG. 5B, an illustration of the internal configuration of the memory cell arrays will not be repeated in FIG. 6.

The layout of the second example is different from the layout of the first example in that the first control circuits 3 are disposed at both ends of the memory cell arrays Ms, Ms+1, Ms+2, Ms+3 in the first direction, respectively, and the second control circuits 4 are disposed at both ends of the memory cell array Ms, Ms+1, Ms+2, Ms+3 in the second direction, respectively. However, "s" of FIG. 6 is set to 1, 5, 9, 13, . . . .

The first control circuits 3 are connected to both ends of the control lines Ls+1 (i−1), Ls+1 (i), Ls+1 (i+1) in the first direction via the switch devices SW1 respectively. The switch devices SW1 are controlled by, for example, control signals φs+1 (i−1), φs+1 (i), φs+1 (i+1), φs+3 (i−1 ), φs+3 (i), φs+3 (i+1). The switch devices SW1 are formed of, for example, an N channel type FET.

The second control circuits 4 are connected to both ends of the control lines Ls(j−1 ), Ls(j), Ls(j+1 ) in the second direction, respectively via the switch devices SW2. The switch devices SW2 are controlled by, for example, control signals φs(j−1), φs(j), φs(j+1), φs+2 (j−1), φs+2 (j), φs+2 (j+1). The switch devices SW2 are formed of, for example, an N channel type FET.

In the resistance change memory using the unipolar operation, the potential levels of the two control lines to which a selected cell unit, which is subjected to the set/reset operation, are controlled so that a forward bias is applied to the non-ohmic device (for example, the PIN diode). In contrast, the potential levels of two control lines, to which the remaining cell units (non-selected cell units) excluding the selected cell unit are connected, are controlled so that a reverse bias is applied to the non-ohmic devices or so that the potential difference between the terminals of the non-ohmic devices becomes 0V.

In the set operation, a voltage of, for example, 3 V to 6 V is applied to the memory devices in the selected cell unit for a period (pulse width) of about 10 ns to 100 ns. A current value of a set current applied to the memory devices (in a high resistance state) is, for example, about 10 nA, and the current density of the set current is set to a value within a range of $1\times10^5$ to $1\times10^7$ A/cm$^2$. As a result, the resistance state of the memory devices in the selected cell unit changes from the high resistance state to a low resistance state.

In the reset operation, a voltage of about 0.5V to 3 V is applied to the memory devices in the selected cell unit for a period (pulse width) of 200 ns to 1 μs. The current value of a reset current applied to the memory devices (in the low resistance state) is about 1 pA to 100 pA, and the current density of the set current is set to a value within a range of $1\times10^3$ to $1\times10^6$ A/cm$^2$. As a result, the resistance state of the memory devices in the selected cell unit changes from the low resistance state to the high resistance state.

Note that the current value of the set current is different from the current value of the reset current. Further, when the set/reset operation of the memory devices depends on the pulse widths of the current and the voltage, the pulse width of the set current is different from the pulse width of the reset current. The voltage value and the period (pulse width) for changing the resistance value of the memory devices in the cell unit depend on a material of the memory devices.

In the read operation of the resistance change memory, the potential level of a selected control line is controlled so that a forward bias is applied to the non-ohmic devices in the selected cell unit likewise in the set/reset operation. It is necessary that the current value of a read current I-read is sufficiently smaller than the current value of a set current I-set and the current value of a reset current I-reset so that the resistance value of the memory devices does not change in the read operation. Further, when the change of the resistance value of the memory devices depends on the pulse width of the current, the pulse width of the read current is set to a pulse width by which the resistance value of the memory devices does not change.

In the resistance change memory shown in FIGS. 5A, 5B, and 6, an area in which interconnects are wired is formed in the chip 1 to connect the control lines of the cross point type memory cell array 2 to the peripheral circuits 3, 4 in the chip 1. The interconnect wiring area is referred to as an interconnect region in the embodiment.

For example, as shown in FIG. 7, an interconnect region 15 is formed on the substrate (for example, the interlayer insulation film) 11 to be adjacent to a region (hereinafter, called a memory cell array region) 12 in which the cross point type memory cell array 2 is disposed. Then, the control circuits 3, 4 and the other circuits 6, 7, 8, 9 and 10 are disposed as peripheral circuits on the surface of the semiconductor substrate (active region) under the memory cell array region 12 and the interconnect region 15.

Note that, in FIG. 7, the interconnect region 15 is disposed so as to surround the memory cell array region 12. However, the interconnect region 15 is not limited to this configuration and may be disposed adjacent only to an end of the memory cell array region 12 in the first direction (or the second direction), or the interconnect regions 15 may be disposed adjacent to one end and the other end of the memory cell array region 12 in the first direction (or the second direction).

The control lines included in the cross point type memory cell array are drawn out from inside of the memory cell array region 12 to the interconnect region 15. To simplify the illustration, FIG. 7 shows the control lines L1 (j) extending in the second direction and the control lines L2 (i) extending in the first direction of the control lines.

A conversion of the line width of the control lines L1 (j), L2 (i), a conversion of the interconnect pitch between the control lines (interconnects), or a connection between interconnects at different interconnect levels are executed in the interconnect region 15.

Interconnects 40 in the interconnect region 15 continuously extend from, for example, the memory cell array region 12. However, the interconnects 40 in the interconnect region 15 are individually disposed in the interconnect region 15, and some of the interconnects 40 are connected to the control lines L1 (i), L2 (j), which are drawn out from the memory cell array region 12 to the interconnect region 15, in the interconnect region 15.

Contact electrodes (ref. 60 in FIG. 8) are disposed in the interconnect region 15. The contact electrodes electrically connect at least two interconnects 40 having a different interconnect level. The contact electrodes are in contact with contact portions 41 disposed at parts of the interconnects 40. In the embodiment, the interconnect level means the height of the interconnects (a position in the third direction) based on a substrate surface as a reference.

The semiconductor device (here, the resistance change memory) of the embodiment includes the control lines L1 (j), L2 (i) and/or the interconnects 40 having the ring-like contact portions 41. Hereinafter, a case, in which the interconnects 40 (control lines L1 (j), L2 (i)) have the ring-like contact portions 41 in the interconnect region 15, will be described. However, it is needless to say that the embodiment includes a case in which the ring-like contact portions 41 are disposed at the control lines L1 (j), L2 (i) and the interconnects 40 in the memory cell array region 12.

An interconnect having the ring-like contact portion 41 will be described using FIGS. 8, 9, and 10. FIG. 8 is a plan view in which a portion, in which a contact portion 41 of an interconnect 40 is formed, is extracted. FIG. 9 is a sectional view along an IX-IX line of FIG. 8. FIG. 10 is a schematic view describing a connection relation between an interconnect to which the ring-like contact portion 41 is disposed and a contact electrode.

As shown in FIGS. 8 to 10, two interconnects, 40, 50, are disposed in the interconnect region 15.

The interconnect 40, the interconnect 50, an interlayer insulation film 81, an interlayer insulation film 82, and an interlayer insulation film 83 are disposed on the substrate 11 via an interlayer insulation film 17. The interconnect 40 is disposed in the interlayer insulation film 82, and the interconnect 50 is disposed in the interlayer insulation film 81 below the interconnect 40. The interlayer insulation film 83 is disposed above the interlayer insulation film 82.

The interconnect 40 and the interconnect 50 are disposed at different interconnect levels, respectively, so that the interconnect 40 is overlapped above the interconnect 50 in the stacked direction (third direction) of the interlayer insulation films 81, 82, 83.

In FIGS. 8 to 10, the interconnect 40 extends in the first direction, and the interconnect 50 extends in the second direction intersecting the first direction. However, as long as the two interconnects 40, 50 are disposed in a layout in which they are overlapped vertically (the third direction), the two interconnects 40, 50 may extend in other directions or in the same direction, respectively.

The contact portion 41 is disposed at a portion of the interconnect 40. The portion (location) of the interconnect 40 where the contact portion 41 is disposed may be an end portion of the interconnect 40 in a direction in which the interconnect extends or may be a portion other than the end portion of the interconnect.

The contact portion 41 projects in a direction (the second direction in FIG. 8) intersecting the extending direction (the first direction in FIG. 8) of the interconnect 40 in a direction (horizontal direction) parallel to the surface of the substrate 11. Note that the contact portion 41 of the interconnect 40 includes not only a portion projecting in the direction intersecting the extending direction of the interconnect 40 but also a portion extending in the extending direction of the interconnect 40.

The contact portion 41 is formed above the interconnect 50 at an interconnect level below the interconnect 40. The contact portion 41 is disposed at a position where it overlaps the lower interconnect 50 vertically.

The contact portion 41 of the embodiment has a ring-like plane shape when viewed from a vertical direction (third direction) to the surface of the substrate 11. In the embodiment, the ring shape is a square annular shape or a circular annular shape, and the portion excluding an outer peripheral portion of the contact portion is configured as a through hole.

The ring-like contact portion 41 having the ring-like plane includes an opening portion (through hole) 49 formed thereto. The opening portion 49 is positioned above the interconnect 50. In the embodiment, the portion excluding the opening portion 49 of the contact portion 41 is referred to as a ring portion 48.

In FIG. 8, although the ring portion 48 and the opening portion 49 of the contact portion 41 have a square plane shape, they are not limited to the square plane shape.

A contact electrode 60 is buried in a contact hole formed in the interlayer insulation films 82, 81 across them. The contact electrode 60 is in contact with the two interconnects 40, 50 having different interconnect levels.

The contact electrode 60 is in contact with the ring portion 48 formed in the contact portion 41 of the interconnect 40. The contact electrode 60 is in contact with the upper surface of the interconnect 50 below the interconnect 40 via (passing through) the opening portion 49 formed in the contact portion 41 of the interconnect 40.

In the direction horizontal to the substrate surface, the size of a portion 61 of the contact electrode 60, which is in contact with the upper surface of the contact portion 41, is set larger than the size of a portion 62 under the portion 61 of the contact electrode 60. That is, the contact electrode 60 has a sectional shape formed convex in a downward direction.

Hereinafter, in the contact electrode 60, the portion 61 on the upper surface of the contact portion 41 is referred to as an upper electrode portion 61, and the portion 62 under the upper portion 61 is referred to as a lower electrode portion 62.

The size of the lower electrode portion 62 in the direction horizontal to the substrate surface is set equal to or smaller than the size of the opening portion 49 of the contact portion 41.

Note that although the contact electrode 60 includes the two electrode portions 61, 62, it is composed of one continuous conductor. Further, although the contact electrode 60 has the square plane shape in FIG. 8, it may have a plane shape including a curved line such as a circular shape and an oval shape.

The contact areas between the respective interconnects 40, 50 and the contact electrode 60 will be described using FIG. 10. In FIG. 10, an illustration of the interlayer insulation films that cover the interconnects 40, 50 and the contact electrode 60 will not be repeated. The interconnect 50 is referred to as an interconnect 50 of a lower layer (a first interconnect level), and the interconnect 40 is referred to as an interconnect 40 of an upper layer (a second interconnect level).

Further, to simplify description, it is assumed that the opening portion 49 formed in the contact portion 41 has the square plane shape. Likewise, an upper surface and a bottom surface of the contact electrode 60 have a square shape. However, as described above, the plane shape of the contact portion 41, the opening portion 49, and the contact electrode 60 is not limited to the square shape, and a shape including the curved line such as the circular shape and the oval shape and a square shape without corners, or with rounded corners also can be applied to the embodiment.

As described in FIGS. 8 and 9, the interconnect 40 of the upper layer includes the ring-like contact portion 41 in FIG. 10. The contact electrode 60 is in contact with the interconnect 40 of the upper layer via the contact portion 41 as well as in contact with the interconnect 50 of the lower layer passing through the ring-like opening portion 49. With such configuration, the contact electrode 60 is electrically connected to the interconnect 40 of the upper layer and to the interconnect 50 of the lower layer.

In FIG. 10, the line width of the ring portion 48 of the contact portion 41 is shown by "RW". The line width RW of the ring portion 48 is set equal to or larger than the line width LW of the interconnect 40.

In FIG. 10, the size of a side of the opening portion 49 formed in the contact portion 41 along the first direction is shown by "X1", and the size of a side of the opening portion 49 along the second direction is shown by "Y1". The size of the opening portion 49 along the third direction is shown by "Z1". The size Z1 is substantially the same as the film thickness of the interconnect 40 and the contact portion 41.

As shown in FIG. 10, the size of the upper surface of the upper electrode portion 61 of the contact electrode 60 along the first direction is shown by "Xce", and the size of the upper surface of the upper electrode portion 61 along the second direction is shown by "Yce". The size of the contact electrode 60 from an upper end to the contact portion 48 along the third direction is shown by "Zce". The sizes Xce, Yce of the upper electrode portion 61 depend on the size of the upper surface of the contact hole in the interlayer insulation film (not shown) in which the upper electrode portion 61 is buried. Further, the size Zce of the upper electrode portion 61 of the contact electrode 60 depends on the film thickness of the interlayer insulation film in which the upper electrode portion 61 is buried.

The contact area (regions Ace1, Ace2 shown by slant lines in FIG. 10) S1 between the contact portion 41 (ring portion 48) and the contact electrode 60 is the sum of a contact area Ace1 between a bottom surface of the upper electrode portion 61 of the contact electrode 60 and the upper surface of the contact portion 41 and a contact area Ace2 between the lower electrode portion 62 of the contact electrode 60 and a side surface of the opening portion 49 (ring portion 48).

The contact area between the bottom surface of the upper electrode portion 61 of the contact electrode 60 and the upper surface of the contact portion 41 corresponds to the value obtained by subtracting the area (X1 ×Y1) of the upper surface of the opening portion 49 from the area (Xa×Ya) of the bottom surface of the contact electrode 60.

The contact area between the lower electrode portion 62 of the contact electrode 60 and the side surface of the opening portion 49 (ring portion 48) corresponds to the area (Z1 ×(2×X1+2×Y1)) of the side surface of the opening portion 49.

Therefore, the contact area S1 between the contact portion 41 and the contact electrode 60 is determined by the following Expression 1.

$$S1 = (Xce \times Yce - X1 \times Y1) + Z1 \times (2 \times X1 + 2 \times Y1) \quad \text{(Expression 1)}$$

The lower electrode portion 62 of the contact electrode 60 passes through the opening portion 49 and comes into contact with the interconnect 50 below the interconnect 40. The sizes of the upper surface of the lower electrode portion 62 are substantially the same as, for example, the sizes X1, Y1 of the opening portion 49.

In FIG. 10, the size of a bottom surface of the lower electrode portion 62 along the first direction is shown by "X2", and the size of the lower electrode portion 62 along the second direction is shown by "Y2". In the case, the contact area S2 between the lower electrode portion 62 of the contact electrode 60 and the lower interconnect 50 is shown by the following Expression 2.

$$S2 = X2 \times Y2 \quad \text{(Expression 2)}$$

Note that when the size Zce of the upper electrode portion 61 in the third direction increases, the sizes Xa, Ya of the bottom surface of the upper electrode portion 61 of the contact electrode 60 tend to become smaller than the sizes Xce, Yce of the upper surface of the upper electrode portion 61. Further, since the contact hole is formed via the opening portion 49, the sizes X1, Y1 of the opening portion 49 become approximately the same as the sizes X2, Y2 of the bottom surface of the lower electrode portion 62. However, the sizes X2, Y2 of the bottom surface of the lower electrode portion 62 of the contact electrode 60 tend to become smaller than the sizes X1, Y1 of the upper surface of the lower electrode portion 62 in response to the magnitude of the size (height) H2 of the lower electrode portion 62 in the third direction; and this relation similarly applies between the sizes Xa, Ya of the bottom surface of the upper electrode portion 61 and the sizes Xce, Yce of the upper surface of the upper electrode portion 61.

Since such tendencies depend on the ratio (aspect ratio) of the size in the first direction (or the second direction) and the size in the third direction, the magnitudes of the contact areas S1, S2 between the respective interconnects 40, 50 and the contact electrode 60 can be controlled by taking the size of the opening portion 49 of the contact portion 41, the opening size of the contact hole in which the contact electrode 60 is buried, and the film thickness of the interlayer insulation films into consideration.

Note that when the size Z1 of the opening portion in the third direction, that is, the film thickness Z1 of the interconnect 40 and the contact portion 41 is sufficiently smaller than the sizes Xce (Xa), Yce (Ya) of the upper electrode portion 61 of the contact electrode 60, the effective value of the contact area S1 between the contact portion 41 and the upper electrode portion 61 becomes the contact area Ace1 between the upper surface of the contact portion 41 (ring portion 48) and the bottom surface of the upper electrode portion 61.

As described above, in the semiconductor device of the embodiment, for example, in the resistance change memory, the contact electrode 60 reaches the lower interconnect 50 via the opening portion 49 of the ring-like contact portion 41 formed at the upper interconnect 40. That is, the alignment position of the lower electrode portion 62 of the contact electrode 60 with the lower interconnect 50 can be determined by determining the magnitude of the opening portion 49 of the contact portion 41 and the position of the opening portion 49 to the lower interconnect 50.

Therefore, in the embodiment, the alignment offset between the contact electrode 60 and the lower interconnect 50 is less affected by the alignment offset between a mask and an interconnect when the contact hole is formed and affected only by the alignment offset between the interconnects 40, 50 disposed at the positions where they are overlapped vertically.

Accordingly, in the semiconductor device in which the one contact electrode 60 is disposed across the interconnects 40, 50 as in the resistance change memory described in the embodiment, a restriction of alignment between the interconnects 40, 50 and the contact electrode 60, which is caused by a lithography process and an etching process for forming the contact hole in which the contact electrode 60 is buried, is relaxed.

Accordingly, in the semiconductor device of the embodiment (for example, in the resistance change memory), the margin of an alignment offset of the contact electrode 60 connected to the interconnects having different interconnect levels can be secured by forming the plane shape of the contact portion 41 formed at the interconnect in the ring shape, without increasing the sizes of the contact electrode 60 and the contact hole in which the contact electrode 60 is buried, and without increasing the sizes of the interconnect 40 and the contact portion 41. As a result, since the sizes of the contact electrode and the contact portion of the semiconductor device of the embodiment need not be increased, an increase of the area occupied by the interconnect region can be prevented in the semiconductor device.

Further, in the embodiment, the contact area S1 between the upper interconnect 40 and the upper electrode portion 61 of the contact electrode 60 includes the sizes X1, Y1 of the opening portion 49 as parameters as shown in Expression 1.

Since the contact electrode 60 reaches the interconnect 50 passing through the opening portion 49, the sizes X2, Y2 of the bottom surface of the lower electrode portion 62 of the contact electrode 60 depend on the sizes X1, Y1 of the opening portion 49.

The contact area S1 between the upper interconnect 40 and the contact electrode 60 (upper electrode portion 61) can be adjusted by the magnitude of the contact hole in which the contact electrode 60 is buried and the sizes of the ring portion 48 of the contact portion 41. However, the sizes (sizes of the opening portion) of the contact hole are preferably small to prevent the increase of the area occupied by the interconnect region 15.

When the contact portion 41 is set to a predetermined area, the area (sizes X1, Y1) of the opening portion 49 and the magnitude of the line width RW of the ring portion 48 can be adjusted.

When, for example, the line width RW of the ring portion 48 is increased in the ring-like contact portion 41, the margin of an alignment offset between the contact electrode 60 and the contact portion 41 disposed to the interconnect 40 can be increased.

Further, when the line width RW of the ring portion 48 is increased, since the size Xce, Yce of the upper electrode portion 61 can be increased, the contact area between the upper electrode portion 61 of the contact electrode 60 and the contact portion 41 can be increased.

Therefore, in the semiconductor device of the embodiment, the margins of the sizes of the contact electrode 60 and the margins of the alignment offset between the contact portion 41 and the contact electrode 60 can be increased by adjusting the line width of the ring portion 48 of the contact portion 41. Further, an increase of the contact resistance between the upper interconnect 40 and the contact electrode 60 can be suppressed.

In contrast, since the contact electrode 60 is in contact with the lower interconnect 50 via the opening portion (space inside of the ring portion 48) 49, when the area of the opening portion 49 is increased, the contact resistance between the contact electrode 60 and the lower interconnect 50 can be reduced.

Therefore, in the semiconductor device of the embodiment, the contact resistance between the interconnect and the contact electrode can be reduced by adjusting the area of the opening portion 49 of the contact portion 41.

Note that when the area of the contact portion 41 is set constant, an increase of the area (sizes X1, Y1) of the opening portion 49 reduces the contact area between the upper surface of the ring portion 48 and the bottom surface of the upper electrode portion 61. However, since the contact area Ace2 between a side surface of the ring portion 48 in the opening portion 49 and a side surface of the lower electrode portion 62 is increased, when the film thickness of the contact portion (interconnect) is increased, even if the opening portion 49 is increased, the influence of reduction of the contact area between the contact portion 41 of the upper interconnect 40 and the contact electrode 60 is reduced.

The contact area S2 between the lower interconnect 50 and the contact electrode 60 (lower electrode portion 62) can be adjusted (controlled) by the size of the opening portion 49.

That is, the magnitude of the contact area S1 and the magnitude of the contact area S2 can be made the same magnitude by adjusting the line width RW of the ring portion and the sizes X1, Y1 of the opening portion 49.

As a result, in the semiconductor device of the embodiment, since the magnitude of the contact resistance generated between the upper interconnect 40 and the contact electrode 60 and the magnitude of the contact resistance generated between the lower interconnect 50 and the contact electrode 60 can be made the same magnitude, a dispersion of the contact resistances generated at the interconnects can be reduced.

As described above, according to the semiconductor device of the embodiment, the contact electrodes can be stably connected to the interconnects.

(2) Specific Example

A specific example of the embodiment will be described using FIGS. 11, 12, 13, 14A, 14B, 14C, 15A, 15B, 15C, 16A, 16B, 17, 18A, 18B, 19A, and 19B by exemplifying a resistance change memory such as a ReRAM (Resistive RAM) and PCRAM (Phase Change RAM).

Note that the detailed description of the components and the effects which are substantially the same as those described using FIGS. 1 to 10 will not be repeated here.

(a) Structure

A structure of the resistance change memory of the specific example of the embodiment will be described using FIGS. 11, 12, and 13. Note that members in a front direction and a depth direction in FIGS. 11 and 13 are shown by broken lines.

Figure 11:
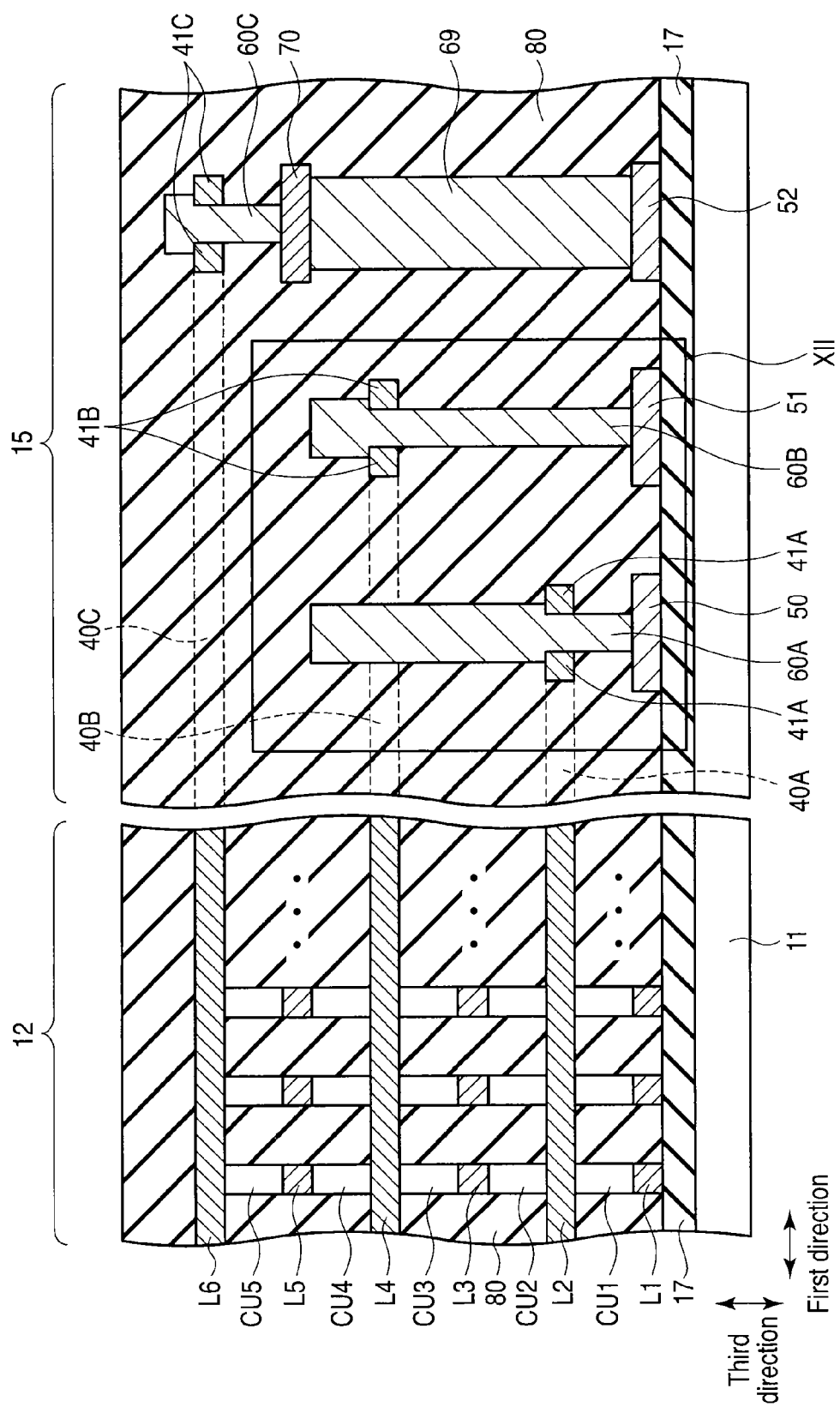
FIG. 11 is view showing a structure example of an interconnect and a contact of a resistance change memory.

FIG. 11 is a view schematically showing sectional structures of a memory cell array region 12 and an interconnect region 15 described in the specific example. FIG. 11 shows the sectional structure of the memory cell array region 12 along the first direction.

Although FIG. 11 shows an example in which the interconnect region 15 is disposed at one end of the memory cell array region 12 in the first direction, it is needless to say that the interconnect region 15 may be disposed at the other end of the memory cell array region 12 in the first direction, or the interconnect regions 15 may be disposed at one end and the other end of the memory cell array region 12 in the second direction in response to a layout of interconnects.

As shown in FIG. 11, a cross point type memory cell array 2 is disposed in the memory cell array region 12. Accordingly, the memory cell array region 12 includes stacked cell units CU1, CU2, CU3, CU4 and CU5. The cell units CU1, CU2, CU3, CU4 and CU5 are stacked on a substrate 11 across control lines L1, L2, L3, L4, L5 and L6, respectively. The cell units CU1, CU2, CU3, CU4 and CU5 and the control lines L1, L2, L3, L4, L5 and L6 are covered by an interlayer insulation film 80.

Interconnects 40A, 40B, 40C and 50 and contact electrodes 60A, 60B, 60C are disposed in the interconnect region 15.

Three interconnects 50, 51, 52 are disposed on an interlayer insulation film 17 in the interconnect region 15. The interconnects 50, 51, 52 extend in a direction (for example, the second direction) intersecting the first direction.

In the interconnect region 15, the interconnects 40A, 40B, 40C are disposed above the interconnects 50, 51, 52. The interconnects 40A, 40B, 40C extend in a direction where they intersect the interconnects 50, 51, 52.

As shown in FIG. 11, the interconnect 40A is disposed at the same interconnect level as the control line L2 and electrically connected to the control line L2. The interconnect 40B is disposed at the same interconnect level as the control line L4 and positioned above the interconnect 40A. The interconnect 40B is electrically connected to the control line L4. The interconnect 40C is formed at the same interconnect level as the control line L6 and positioned above the interconnect 40B. The interconnect 40C is electrically connected to the control line L6.

Note that although FIG. 11 shows the interconnects 40A, 40B, 40C at the same levels as the control lines L2, L4, L6, it is needless to say that interconnects at the same interconnect levels as the control lines L1, L3, L5 are disposed in the interconnect region 15.

The interconnects 40A, 40B, 40C have ring-like contact portions 41A, 41B, 41C, respectively.

The contact electrodes 60A, 60B, 60C connect interconnects disposed at different interconnect levels via opening portions of the ring-like contact portions 41A, 41B, 41C.

The interconnect 40A is connected to the interconnect 50 by the contact electrode 60A passing through the ring-like contact portion 41A. The interconnect 40B is connected to the interconnect 51 by the contact electrode 60B passing through the ring-like contact portion 41B.

For example, the interconnect 40C is connected to an intermediate layer 70 at the same interconnect level as the control line L5 by the contact electrode 60A passing through the ring-like contact portions 41C. The control line L5 is positioned at an interconnect level between the control line L4 and the control line L6. Further, the control line L5 and the intermediate layer 70 are made of the same material.

The intermediate layer 70 does not have a ring-like contact portion, and the contact electrode 60C does not pass through the intermediate layer 70. The intermediate layer 70 is connected to the interconnect 52 by a contact electrode 69. As a result, the upper interconnect 40C is electrically connected to the lower interconnect 52 by appropriately combining the contact electrode 60C passing through an opening portion in the contact portion 41C, the intermediate layer 70, and the ordinary contact electrode 69.

FIG. 12 shows a plan view of a region XII of FIG. 11 when viewed from the third direction (upper side). FIG. 13 shows cross sections along an A-A' line and a B-B' line of FIG. 12. To clarify a difference, FIG. 13 shows the cross sections along the A-A' line and the B-B' line side by side without showing the interlayer insulation film.

As shown in FIGS. 12 and 13, the interconnect 50 and the interconnect 51 are disposed side by side in the first direction when viewed from the third direction at the same interconnect level (on the substrate 11).

The interconnect 40A and the interconnect 40B are disposed side by side in planes, where the contact portions 41A, 41B thereof are disposed, in the second direction when viewed from the third direction. The interconnect 40A and the interconnect 40B are disposed at different interconnect levels, respectively. Note that the interconnect 40A and the interconnect 40B are drawn in the interconnect region 15 so that they are formed in a predetermined interconnect layout.

The contact portion 41A of the interconnect 40A is disposed at a position where it is not overlapped vertically on the contact portion 41B of the interconnect 40B. The ring-like contact portion 41A is positioned above the interconnect 50, and the ring-like contact portion 41B is positioned above the interconnect 51.

The ring-like contact portion 41A disposed at the interconnect 40A projects to the interconnect 40B side with respect to the surface of the substrate 11 in a horizontal direction. The ring-like contact portion 41B disposed to the interconnect 40B projects to the interconnect 40A side with respect to the surface of the substrate in the horizontal direction. The directions in which the contact portions 41A, 41B project are opposite to each other. An increase of the area of the interconnect region 15 is suppressed by disposing the contact portions 41A, 41B so that they alternately project in a different direction in the interconnects adjacent to each other in the horizontal direction in the planes with respect to the surface of the substrate 11 when viewed from the third direction.

Note that FIGS. 11 to 13 show the example in which the contact portions 41A, 41B at the different interconnect levels are disposed so as to alternately project. However, it is needless to say that the same effect can be also obtained even in a case in which two contact portions at the same interconnect level alternately project.

As described using FIGS. 8, 9, and 10, the resistance change memory shown in FIGS. 11, 12, and 13 includes the interconnects 40A, 40B having the contact portions 41A, 41B whose plane shape is formed in the ring-shape, and the margin of an alignment offset of the contact electrodes 60A, 60B of the upper interconnects 40A, 40B and of the lower interconnects 50, 51 can be secured by controlling the line widths of the ring portions 48A, 48B of the contact portions 41A, 41B and the sizes of the opening portions 49A, 49B.

Accordingly, since the resistance change memory of the specific example of the embodiment can secure a margin of an alignment offset without increasing the sizes of the contact portions 41A, 41B in the interconnect region 15 and the sizes of the contact electrodes 60A, 60B and the interconnects 40A, 40B, 50, 51, an increase of the area occupied by the interconnect region 15 on the surface of the chip (substrate 11) can be suppressed.

The contact area between the contact electrodes 60A, 60B and the upper interconnects 40A, 40B can be set within a certain predetermined range by setting the line widths of the ring portions 48A, 48B of the contact portions 41A, 41B to sizes that account for the alignment offset. Further, the contact area between the contact electrodes 60A, 60B and the lower interconnects 50, 51 can be adjusted by controlling the sizes of the opening portions 49A, 49B of the contact portions 41A, 41B.

As a result, the contact resistances between the respective interconnects 40A, 40B, 50, 51 and the contact electrodes 60A, 60B in the specific example of the embodiment of the resistance change memory can be reduced. Further, as described later, a dispersion of electric characteristics of the interconnects 40A, 40B, 50, 51 can be suppressed, resulting from the reduction in a dispersion of the contact resistances between the respective interconnects 40A, 40B, 50, 51 and the contact electrodes 60A, 60B. Accordingly, the contact electrodes 60A, 60B can be electrically stably connected to the respective interconnects 40A, 40B, 50, 51.

Note that, when the two contact electrode 60A, 61, which are connected to the interconnects 40A, 40B at the different interconnect levels, are formed by processes executed at the same time, the effect described above can be more prominently obtained.

As described above, according to the resistance change memory of the specific example of the embodiment, occurrence of the alignment offset of the interconnects and the dispersion of the electric characteristics can be suppressed.

(b) Manufacturing Method

An example of a manufacturing method of the resistance change memory as a specific example of the embodiment will be described as an example of the manufacturing method of the semiconductor device of the embodiment using FIGS. 14A, 14B, 14C, 15A, 15B, 15C, 16A, 16B, 17, 18A, 18B, 19A, and 19B.

Figure 14B:
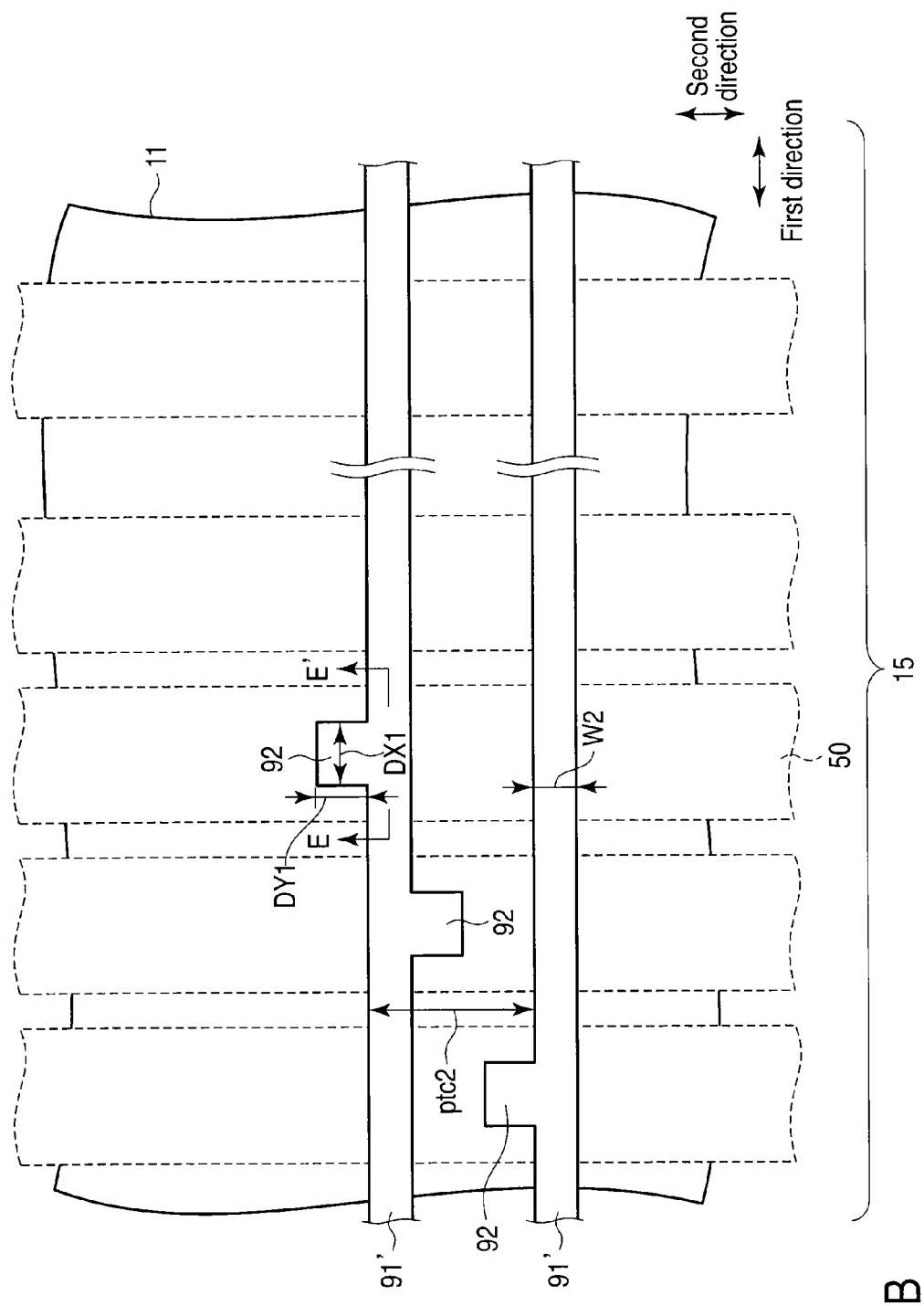
FIG. 14B is view showing a process of a method of manufacturing the resistance change memory.

FIG. 14A shows a plane structure of the memory cell array region 12 in a process of the manufacturing method of the resistance change memory according to the specific example of the embodiment, and FIG. 14B shows a plane structure of the interconnect region 15. FIG. 14C shows a sectional structure along a D-D' line of FIG. 14A and a sectional structure along an E-E' line of FIG. 14B, respectively. Note that a cross section along the D-D' line of FIG. 14A corresponds to a cross section of the memory cell array region 12 shown in FIG. 2 along the first direction.

As shown in FIGS. 14A, 14B, and 14C, a conductive layer is deposited on the substrate (for example, the interlayer insulation film 17) 11 using, for example, CVD (Chemical Vapor Deposition) and sputtering. The conductive layer is made into a control line of a lowermost layer in the memory cell array region 12 and an interconnect of a lowermost layer in the interconnect region 15.

Layers for forming a rectifier device (non-ohmic device) and a memory device of a cell unit are sequentially deposited on the conductive layer using, for example, CVD (Chemical Vapor Deposition) or sputtering. A stacking order of the layers for configuring the cell unit differs according to a configuration of the rectifier device and the memory device shown in FIG. 4.

When the cell unit has the configuration shown in FIG. 3B, the non-ohmic device is, for example, a PIN diode. In the case, three semiconductor layers are stacked on a lower electrode layer of the non-ohmic device formed on an interconnect layer. For example, a silicide layer is formed on an uppermost semiconductor layer (for example, a P-type semiconductor layer) as upper electrode layers of the PIN diode.

A lower electrode layer, a resistance change film, and an upper electrode layer of the memory device are sequentially stacked on the silicide layer.

Further, simultaneously with the deposition of the respective layers on the memory cell array region 12, layers are deposited on the substrate 11 in the interconnect region 15.

The conductive layer and the layers on the substrate 11 are processed using photolithography, side wall processing, and RIE (Reactive Ion Etching), and control lines L1 and stacked bodies 100A extending in the second direction are formed. The stacked bodies 100A are formed on the control lines L1. The control lines L1 and the stacked bodies 100A are disposed side by side in the first direction intersecting the second direction.

Simultaneously with the processing of the memory cell array region 12, the interconnect region 15 is processed. For example, layers having the same configuration as the stacked bodies 100A are removed in the interconnect region 15, and the interconnects 50 having a predetermined layout and shape are formed at the same interconnect level as the control lines L1.

Thereafter, the interlayer insulation film 81 is formed in the memory cell array 2 and in the interconnect region 15 in the substrate 11 by, for example, CVD or coating. With such configuration, the interlayer insulation film 81 is buried between the cell units adjacent to each other in the first direction. The interconnect 50 above the substrate 11 (interlayer insulation film 17) is covered by the interlayer insulation film 81.

After the interlayer insulation film 81 is subjected to a planar processing, a conductive layer 59A is formed on the interlayer insulation film 81 using, for example, sputtering or CVD.

The cell units may be formed by dividing the stacked bodies 100A in the second direction using RIE, thereby forming the memory cell array of the lowermost layer. However, to simplify the manufacturing process, it is preferable to deposit a component of a second memory cell array M2 from the substrate side on a conductive layer 59A and to simultaneously execute a processing (etching) in the second direction on a lowermost (first) memory cell array M1 and on a second memory cell array M2 without dividing the stacked bodies 100A in the second direction at this stage.

In the case, layers (stacked bodies) 100B', which constitute the second memory cell array M2 from the substrate side, are formed on the conductive layer 59A. Then, the upper stacked bodies 100B' and the stacked bodies 100A extending in the first direction are commonly processed in the second direction, respectively by a process described later. As a result, the manufacturing process of the resistance change memory having a cross point type memory cell array is simplified and a manufacturing cost of the resistance change memory is reduced as compared with a case in which each of the memory cell arrays of each layer (at each interconnect level) is processed in the first direction and the second direction.

As shown in FIGS. 14A, 14B, and 14C, a mask material used for a processing in the second direction is deposited on the stacked bodies 100B' in the memory cell array region 12 and on stacked bodies 101 in the interconnect region 15. The mask material is processed in a predetermined layout and shape by photolithography and RIE, and core members 91 are formed on the stacked bodies 100B', 101. The core members (mask material) 91 are made of a material which can secure an etching select ratio on the conductive layer 59A.

Note that layers (transfer layers), which become substantial masks by being transferred with mask patterns, may be disposed between the core members 91 and the stacked bodies 100B'.

As shown in FIG. 14A, in the memory cell array region 12, the core members 91 have a linear plane pattern extending in the first direction. The linear core members 91 are disposed adjacent to each other in the second direction.

The size (line width) W1 of the linear core members 91 in the second direction is set, for example, equal to or smaller than a limit of processing executed by photolithography. The adjacent pitch ptc1 of two core members 91 adjacent in the second direction is, for example, about four times the size of the stacked bodies 100A in the first direction.

In FIG. 14B, core members 91' in the interconnect region 15 show core members 91' extending in the first direction. However, the core members 91' in the interconnect region 15 are patterned to have a predetermined layout and shape in response to a layout of interconnects formed in a process, to be described later, different from a layout and shape of the core members 91' in the memory cell array region 12.

The core members 91' in the interconnect region 15 may be members that continue from the memory cell array region 12 to the interconnect region 15 or may be members that are separated from the core members 91 of the memory cell array region 12.

The core members 91' have projecting portions 92 projecting in a direction (for example, the second direction) intersecting the direction in which the core members 91' extend. The portions of the core members 91' other than the projecting portions 92 are also called main portions.

The projecting portions 92 are formed at the positions where they overlap, for example, the lower interconnect 50 vertically. The projecting portions 92 are formed at the positions where contact electrodes are connected to the interconnect 50. The sizes DX1, DX2 of the projecting portions 92 in the first and second directions are appropriately set in response to the magnitude of contact portions disposed on the interconnects.

The projecting portions 92 disposed on the respective core members 91' are disposed so as to alternately project in two core members 91' adjacent to each other.

The size (line width) W2 of the portions (main portions) of the core members 91' other than the projecting portions 92 in the second direction is, for example, equal to or larger than the line width W1 of the core members 91 in the memory cell array region 12.

The adjacent pitch ptc2 of the main portions of two core members 91 is set larger than the adjacent pitch ptc1 of the two core members 91' in the memory cell array region 12 so that the projecting portion 92 of a core member 91' is not in contact with another adjacent core member.

Figure 15B:
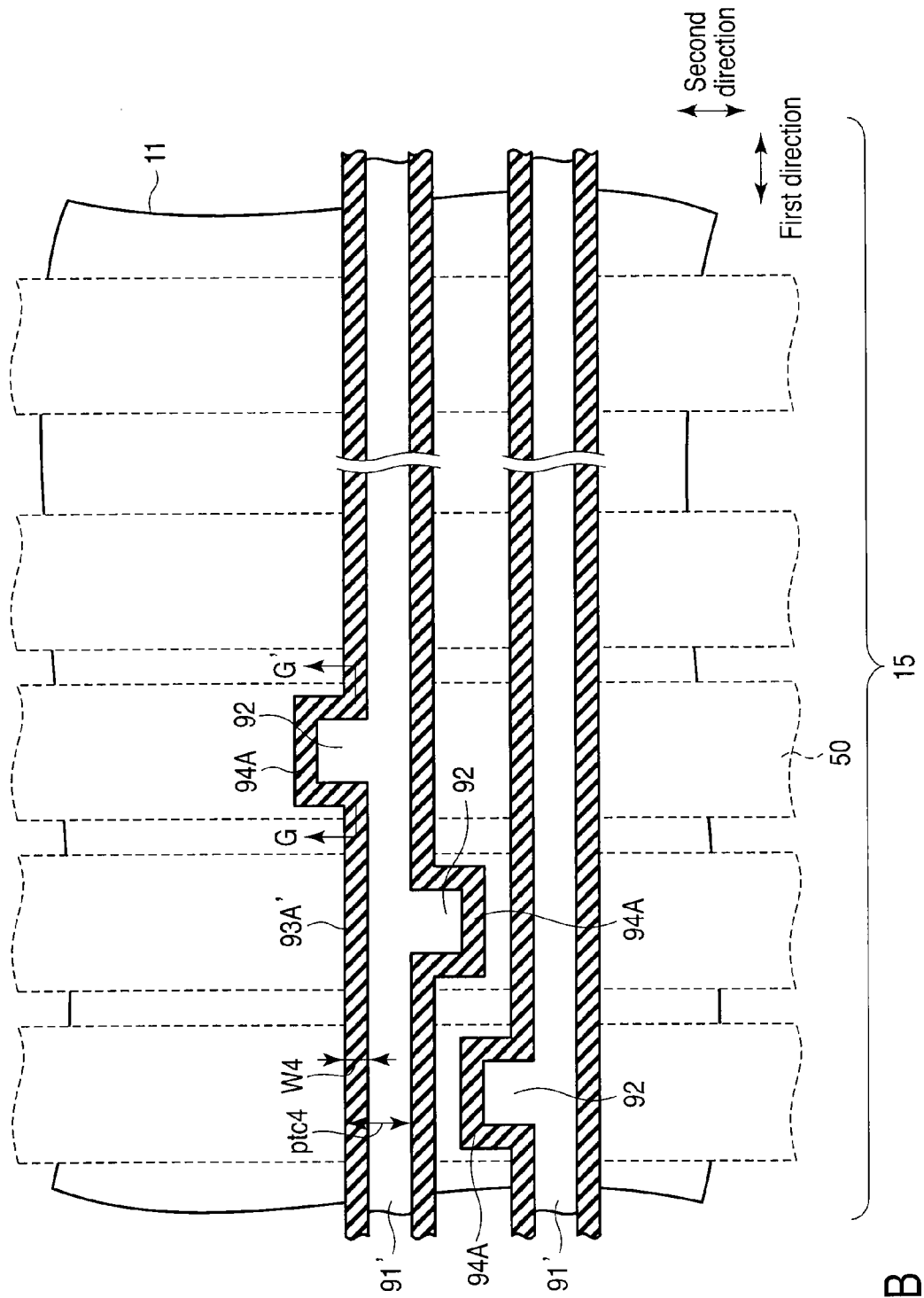
FIG. 15B is view showing a process of a method of manufacturing the resistance change memory.

FIG. 15A shows a plane structure of the memory cell array region 12 in a process of the manufacturing method of the resistance change memory as the specific example of the embodiment, and FIG. 15B shows a plane structure of the interconnect region 15 in the process of the manufacturing method. FIG. 15C shows a sectional structure along an F-F' line of FIG. 15A and a sectional structure along a G-G' line of FIG. 15B.

As shown in FIGS. 15A, 15B, and 15C, a sidewall masking material is deposited on the conductive layer 59A in the memory cell array region 12 and the interconnect region 15 so as to cover the core members 91, 91' using, for example, CVD or sputtering. The sidewall masking material is made of a material which can secure an etching selection ratio for the core members 91, 91' and the conductive layer 59A.

When anisotropic etching is executed on the sidewall masking material, the mask material remains on side surfaces of the core members 91, 91' and side wall masks 93A, 93A' are formed in self-alignment so as to surround the peripheries of the core members 91, 91'. Just after the side wall masks 93A, 93A' are formed, they have a closed-loop like plane shape around the peripheries of the core members 91, 91'. Looped portions of the side wall masks 93A, 93A' are cut off at the ends of the core members 91, 91' in the extending direction thereof, and the side wall masks 93A, 93A' are formed in independent patterns, respectively.

As shown in FIG. 15A and FIG. 15C, the side wall masks 93A are formed along side surfaces of the linear core members 91 in the memory cell array region 12. In the memory cell array 2, the side wall masks 93A have a linear pattern and extend in the first direction.

The size (line width) of the side wall masks 93A in the memory cell array 2 in the second direction is set, for example, smaller than a limit of processing executed by photolithography and is, for example, approximately the same as or smaller than the line width W1 of the core members 91. The adjacent pitch ptc3 of two side wall masks 93A adjacent in the second direction is the sum of, for example, the line width W3 of the side wall masks 93A and the line width of the core members 91.

As shown in FIGS. 15B and 15C, in the interconnect region 15, the side wall masks 93A' are formed on side surfaces of the core members 91'. As described above, since the core members 91' in the interconnect region 15 have the projecting portions 92 projecting in the second direction, the shape of the side wall masks 93' in the interconnect region 15 is curved due to the shape of the projecting portions 92. Hereinafter, in the side wall masks 93A' in the interconnect region 15, portions 94A, which are curved in response to the shape of the projecting portions 92, are particularly called curved portions 94A. The curved portions 94A have, for example, a concave (or U-like) plane shape.

In side wall masks 93A' adjacent to each other in the second direction in the interconnect region 15, the pitch ptc4 of the portions other than the curved portions 94A is substantially the same as the sum of the line width W2 of the core members 91' and the line width W4 of the side wall masks 93A'.

The size (line width) W4 of the side wall masks 93A' in the interconnect region 15 in the second direction is substantially the same as, for example, the line width W3 of the side wall masks 93A in the memory cell array region 12. The side wall masks 93A' of the curved portions 94A also have the line width W4.

However, the line width W4 of the side wall masks 93A' may be different from the line width W3 of the side wall masks 93A depending on the adjacent pitch ptc4 between the core members 91'. In other words, the size of the line width W4 of the side wall masks 93A and the curved portions 94A can be controlled by adjusting the adjacent pitch ptc4.

The curved portions 94A of the side wall masks 93A' and the portions of the projecting portions 92 adjacent to the curved portions 94A have an interval via which they are not in contact with each other. The interval is set by adjusting the interval between the projecting portions 92 of the core members 91' of FIG. 14B and the core members 91' adjacent to the projecting portions 92 when the projecting portions 92 are formed.

FIG. 16A shows a plane structure of the interconnect region 15 in a process of the manufacturing method of the resistance change memory as the specific example of the embodiment. FIG. 16B shows a sectional structure along an H-H' line of FIG. 16A and a sectional structure along an I-I' line of FIG. 16A. Note that, in the process, since the structure of the memory cell array region 12 is substantially the same as that in the manufacturing process shown in FIGS. 15A, 15B, and 15C, illustration of the structure will not be repeated here.

In the process shown in FIGS. 16A and 16B, the core members in the memory cell array region 12 and in the interconnect region 15 are selectively removed using, for example, wet etching, RIE, and the like. As a result, opening portions OP are formed which are surrounded by the curved portions 94A of the side wall masks 93A' as well as parts of which have segmented portions in which the side wall masks 92, 93A' are segmented. Thereafter, in the interconnect region 15, resist masks 95A are formed on the stacked bodies 101 using photolithography.

The resist masks 95A are formed to bridge one ends and the other ends of the side wall masks 93A' segmented in the segmented portions of the openings OP formed to the curved portions 94A in the first direction. The portions, which are surrounded by the curved portions 94A and the resist masks 95A, are made into cavities. The resist masks 95A are formed so as not to be in contact with the portions of the curved portions 94A adjacent thereto in the second direction.

As shown in FIGS. 16A and 16B, ring-like mask patterns 99A are formed by the resist masks 95A and the curved portions 94A of the side wall masks 93A'. Further, the opening OP, which are surrounded by the ring-like mask patterns 99A, are made into cavities, and upper surfaces of the stacked bodies 101 are exposed via the openings OP.

The size X1 of the openings OP of the ring-like mask patterns 99A in the first direction depends on an interval between the two portions of the curved portions 94A extending in the second direction. That is, the size X1 of the openings OP of the mask patterns 99A in the first direction is determined by the size of the projecting portions 92 of the core members 91' of FIG. 14B in the first direction.

The size Y2 of the openings OP of the ring-like mask patterns 99A in the second direction depends on the magnitude of the curved portions 94A in the second direction, the positions where the resist masks 95A are formed to the curved portions 94A, and the magnitude (size) of the resist masks 95A.

Note that, in the memory cell array region 12, only the core members are removed and the resist masks are not formed.

The conductive layer and the stacked bodies are processed using the side wall masks 93A, 93A', 94A and the resist masks 95A.

FIG. 17 shows a sectional structure after the conductive layer and the stacked bodies are processed using the side wall masks and the resist masks.

FIG. 17 shows sectional structures disposed side by side after the processing, the sectional structures corresponding to the F-F' line of FIG. 15A, a J-J' line of FIG. 15A, the H-H' line of FIG. 16A, and the I-I' line of FIG. 16A.

In the memory cell array region 12, stacked bodies 100B and the control lines L2 which extend in the first direction are formed based on the linear side wall mask extending in the first direction.

Further, the stacked bodies extending in the second direction on the control lines L1 are processed based on the side wall mask extending in the first direction and divided to the cell units CU1. However, in the process, the lower control lines L1 are not etched. The cell units CU1 are disposed at the locations where the lower control lines L1 intersect the upper control lines L2. When the memories operate, the control lines L1 or the control lines L2 are driven as the word lines, and the remaining control lines are driven as the bit lines.

As described above, the memory cell array M1, in which the cell units CU1 are two-dimensionally disposed, is formed in the memory cell array region 12.

Simultaneously with the processing of the memory cell array region 12, the conductive layer in the interconnect region 15 is processed by the side wall masks 93A' and the resist masks 95A shown in FIGS. 16A and 16B.

With this operation, the interconnect 40A, which extends from the memory cell array region 12 to the interconnect region 15, is formed based on a predetermined interconnect layout and shape. For example, the control lines L2 in the memory cell array region 12 are not cut off from the interconnect 40A in the interconnect region 15 and are configured as continuous conductive wires.

The ring-like contact portions 41A are formed to the interconnect 40A in the interconnect region 15 by the ring-like mask patterns 99A composed of the resist masks 95A and the side wall masks 93A' in the curved portions 94A. The opening portion 49A of the contact portion 41A is formed in the ring portion 48.

The line width and the area of the ring portion 48A of the contact portion 41A are determined corresponding to the line widths of the side wall masks 93A' and the resist masks 95A. The magnitude of the opening portion 49 of the contact portion 41A is determined corresponding to the sizes of the projecting portions 92 of the core members 91' in the first and second directions, the size of the resist masks 95A, and the positions where the resist masks 95A are formed to the curved portions 94A of the side wall masks 93A'.

In the process shown in FIGS. 14A, 14B, and 14C, when the core members 91' are formed, the projecting portions disposed to the core members 91' are alternately projected toward adjacent core members side in two core members adjacent to each other in the second direction. Accordingly, the ring-like contact portions 41A, which are processed based on the core members 91' and the side wall masks 93A', are disposed also alternately toward adjacent interconnects side in two interconnects. That is, a layout in the interconnect region 15 does not have a layout in which two contact portions 41A face each other.

As described above, since the positions where the ring-like contact portions 41A are formed are alternately offset to adjacent interconnects, even if the plane shape of the contact portion 41A is formed in the ring shape, an increase of the area occupied by the interconnect region, which is caused by the formation of the contact portion 41A, is suppressed.

As shown in FIG. 17, the two memory cell arrays M1, M2 are processed in the second direction at the same time. Simultaneously with the processing, the interconnects in the interconnect region 15 are processed at the same time. Thereafter, the side wall masks and the resist masks are removed. Further, in the interconnect region 15, components of the stacked bodies 100B remaining in the interconnect region 15 are removed. Note that the same components as the stacked bodies 100B in the interconnect region 15 may not be removed and may remain in the interconnect region 15 as dummy layers.

Thereafter, interlayer insulation films (not shown) are buried between the cell units CU1 adjacent to each other in the second direction and between the stacked bodies 100B adjacent to each other in the second direction using, for example, coating and CVD. At the same time, interlayer insulation films are deposited also in the interconnect region 15.

Figure 18A:
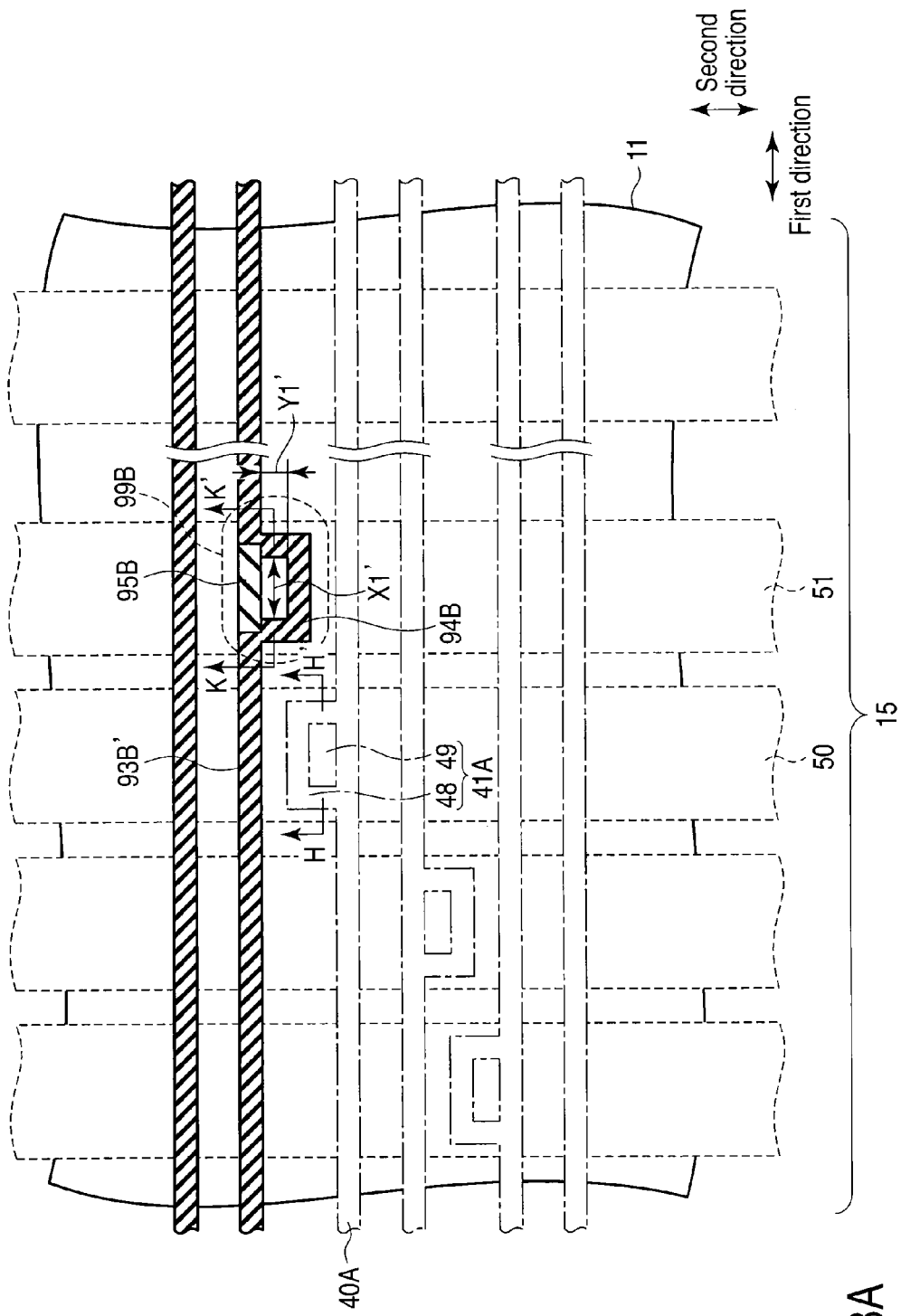
FIG. 18A is view showing a process of a method of manufacturing the resistance change memory.

FIG. 18A shows a plane structure of the interconnect region 15 in a process of the manufacturing method of the resistance change memory as the specific example of the embodiment. FIG. 18B shows a sectional structure along an H-H' line of FIG. 18A and a sectional structure along a K-K' line of FIG. 18A. Further, FIG. 18B shows also a sectional structure of the memory cell array region 12 along the second direction in the process shown in FIG. 18A.

In the process shown in FIGS. 18A and 18B, a conductive layer and a component of the third memory cell array M3 from the substrate side are sequentially deposited on the components (stacked bodies) of the second memory cell array M2 by processes substantially the same as the processes shown in FIGS. 14A, 14B, 14C, 15A, 15B, 15C, 16A, 16B, and 17. The stacked bodies for configuring the memory cell array M2 and stacked bodies 100C for configuring the memory cell array M3 are processed in the first direction at the same time. The control lines L3 extending in the second direction are formed simultaneously with the processing of the memory cell arrays M2, M3.

Ring-like contact portions are formed to the interconnects in the interconnect region on the second direction side with respect to, for example, the control lines L3 by the same processes as those shown in FIGS. 14A to 17.

After the cell unit CU2 that configures the second memory cell array M2 is formed, an interlayer insulation film 82 is deposited in the memory cell array region 12 and in the interconnect region 15.

In the memory cell array region 12 and in the interconnect region 15, a conductive layer 59B for forming control lines extending in the first direction is deposited on the insulation film 82. Further, components 100D' of the fourth memory cell array M4 from the substrate side are formed on the conductive layer 59B.

As shown in FIGS. 18A and 18B, linear side wall masks 93B are formed in the memory cell array region 12 and side wall masks 93B' having curved portions 94B are formed in the interconnect region 15 on the components 100D' by the same processes as those shown in FIGS. 14A, 14B, 14C, 15A, 15B, 15C, 16A, and 16B. Further, resist masks 95B are formed on the stacked bodies 100D' across openings of the curved portions 94B. With such configuration, ring-like mask patterns 99B are formed above the interconnect 51 and the conductive layer 59B. For example, the ring-like mask patterns 99B are formed at the positions where they are not overlapped vertically on the ring-like contact portions 41A formed at interconnect levels below the mask patterns 99B (in the third direction).

The portions surrounded by the curved portions 94B and the resist masks 95B are configured as cavities having certain sizes in the first and the second directions. The size of cavities of the mask patterns 99B for forming the contact portions of an upper interconnect may or may not have the same size as the opening portions 49 of the ring-like contact portions 41A of the lower interconnect 40A.

As shown in FIGS. 18A and 18B, the contact portion formed by the ring-like mask patterns 99B is formed at an interconnect level above the interconnect 40A.

As described above, the mask pattern is formed so that the ring-like contact portions have an alternate layout in planes in interconnects adjacent to each other in the second direction (or in the first direction) when viewed from the third direction as to also the contact portions disposed respectively to the interconnects at different interconnect levels. As a result, the area occupied by the interconnect region 15 in which the ring-like contact portions are disposed can be reduced.

The stacked bodies for configuring the third memory cell array M3 and the fourth memory cell array are formed in the memory cell array region 12 using the side wall masks and the resist masks, and the interconnects having the ring-like contact portions are formed in the interconnect region 15. Thereafter, in the interconnect region 15, the components of the cell units are removed, and interlayer insulation films are deposited in the memory cell array region 12 and in the interconnect region 15.

FIGS. 19A and 19B show a process of the manufacturing process of the resistance change memory as the specific example of the embodiment. FIGS. 19A and 19B show a sectional structure of the process of the manufacturing process for the interconnect region 15, and the sectional structure corresponds to cross sections along the H-H' line and the K-K' line of FIG. 18A. Note that illustration of the manufacturing process for the memory cell array region 12 will not be repeated here.

As shown in FIG. 19A, after the ring-like contact portions 41A, 41B are formed at two different interconnect levels, contact holes CHA, CHB are formed to bury contact electrodes 60A, 60B to the interconnects 40A, 40B at different interconnect levels therein, respectively. The contact holes CHA, CHB are formed in the interlayer insulation films 81, 82, 83 by executing etching once. The contact holes CHA, CHB partially expose upper surfaces of the ring-like contact portions 41A, 41B disposed to the interconnects 40A, 40B, respectively, as well as expose upper surfaces of the interconnect 50 and the interconnect 51 via the opening portions 49A, 49B of the contact portions 41A, 41B. As shown in FIG. 19B, the contact electrodes 60A, 60B are buried in the contact holes CHA, CHB at the same time.

As described above, since the contact holes CHA, CHB are collectively processed (etched) to the interconnects at the interconnect levels, the number of processes for manufacturing the resistance change memory is reduced.

In a conventional contact electrode forming process, when one contact electrode is formed to interconnects disposed below an interconnect level, the contact electrode 60A connected to lower and upper interconnects is aligned to any one interconnect of the interconnects at interconnect levels and cannot be directly aligned to the other interconnects. Accordingly, there is a possibility that the alignment of the contact electrode 60A to the interconnects which cannot be directly aligned to the contact electrode 60A is offset. This may cause a deterioration of a manufacturing yield of the resistance change memory. To prevent the deterioration of the manufacturing yield, it is necessary in a conventional resistance change memory to increase the size of the interconnects and the size of contact portions disposed to the interconnects or the size of contact holes to increase an alignment margin.

Further, the contact areas between the contact electrode and the respective interconnects are dispersed by the alignment offset. In particular, in the interconnects which cannot be directly aligned to the contact electrode, since only a part of the contact electrode comes into contact with (hooked to) parts of the interconnects (contact portions), the interconnects are greatly affected by the alignment offset.

As a result, there is a possibility that the contact resistances between the contact electrode and the respective interconnects are dispersed and thus the electric characteristics of the interconnects are dispersed.

In the semiconductor device, for example, in the resistance change memory of the embodiment, the contact portions 41A, 41B formed to the interconnects 40A, 40B have the ring-like plane shape.

An alignment between the contact electrodes 60A, 60B and the interconnects 40A, 40B having the ring-like contact portions 41A, 41B is determined by the ring portions 48A and 48B of the contact portions 41A, 41B.

An alignment of the contact electrodes 60A, 60B to the interconnects below the interconnects 40A, 40B having the ring-like contact portions 41B, 41B is determined by the sizes X1, X1' in the first direction and the sizes in the second direction of the opening portions (inside of the ring portions) 49A, 49B of the ring-like contact portions 41A, 41B.

That is, the alignment between the upper interconnects 40A, 40B and the contact electrodes 60A, 60B is set within the range of the areas of the ring portions 48A, 48B, and an alignment between the lower interconnects 50, 51 and the contact electrodes 60A, 60B is set within the range of the magnitudes of the opening portions 49A, 49B.

Therefore, when the contact portions 41A, 41B have the ring-like plane shape as in the resistance change memory as the specific example of the embodiment, it is sufficient to determine the alignment of the contact electrodes 60A, 60B (the positions where the contact holes are formed) only in consideration of an alignment offset between the contact portions 41A, 41B and the interconnects below the contact portions 41A, 41B.

Accordingly, when the ring-like contact portions 41A, 41B are formed to the interconnects 40A, 40B as in the resistance change memory of the example, a restriction to an alignment for forming the contact electrode 60A, 60B is relaxed in the contact electrodes 60A, 60B which are commonly connected to the interconnects 40A, 40B, 50, 51 across interconnect levels.

Further, when the sizes and the areas of the ring portions 48A, 48B of the contact portions 41A, 41B are designed in consideration of an alignment offset between the contact electrodes 60A, 60B and the contact portions, a dispersion of the contact areas A-xy, A'-xy between the contact electrodes 60A, 60B and the ring-like contact portions 41A, 41B can be suppressed in the respective interconnects 40A, 40B having the contact portions 41A, 41B.

Further, since the contact electrodes 60A, 60B are in contact with the upper surfaces of the ring-like contact portions 41A, 41B, even when the contact electrodes 60A, 60B and the contact portions 41A, 41B cause an alignment offset in any of the first direction and the second direction or in both the first and second directions, the dispersion of the contact areas A-xy, A'-xy between the contact electrodes 60A, 60B and the ring-like contact portions 41A, 41B can be suppressed.

As a comparative example, a case, in which the resist masks 95A are not formed and the ring-like contact portions are partially segmented in FIG. 16A, will be examined. In the comparative example, when the contact electrodes 60A, 60B and the contact portions 41A, 41B cause an alignment offset in the second direction, the contact areas between the contact electrodes 60A, 60B and the contact portions 41A, 41B are changed as compared with a case in which they do not cause the alignment offset. As a result, the contact resistances between the contact electrodes 60A, 60B and the interconnects 40A, 40B are changed.

In contrast, since the contact portions 41, 41B have the ring-like plane shape, even when the contact electrodes 60A, 60B and the contact portions 41A, 41B cause an alignment offset in any of the first and second directions or in both the first and second directions, the contact areas A-xy, A'-xy between the contact electrodes 60A, 608 and the ring-like contact portions 41A, 41B remain constant. As a result, a change of the contact resistances between the contact electrodes 60A, 60B and the interconnects 40A, 40B can be prevented.

A dispersion of the contact areas B-xy, B-xy' between the contact electrodes 60A, 60B and the interconnects 50, 51 can be suppressed also for the lower interconnects 50, 51 similarly to the upper interconnects 40A, 40B by adjusting the sizes and the areas of the opening portions 49A, 49B of the contact portions 41A, 41B.

In addition to that mentioned above, the contact areas B-xy, B'-xy between the lower interconnects 50, 51 and the contact electrodes 60A, 60B can be set by controlling the magnitudes of the opening portions (inside of the ring portions 48A, 48B) 49A, 49B of the contact portions 41A, 41B in consideration of the contact areas A-xy, A'-xy between the upper interconnects 40A, 40B and the contact electrodes 60A, 60B.

Therefore, a dispersion of the contact resistance of the interconnects due to a dispersion of the contact areas can be suppressed.

Note that the sizes of the ring portions 48A, 48B and the opening portions 49A, 49B of the contact portions 41A, 41B can be controlled by the magnitude of the projecting portions of the core members which are formed by the processes shown in FIGS. 14A, 14B, 14C, 15A, 15B, 15C, 16A, 16B, 17, 18A, and 18B, the size of the side wall masks in the interconnect region 15, the size of the resist masks, and the positions where the resist masks are formed to the curved portions.

Thereafter, substantially the same processes as those shown in FIG. 14A to FIG. 18B are repeatedly executed until the number of the memory cell arrays and the interconnects in the memory cell array region 12 reaches a predetermined stack number.

Note that although the manufacturing process for the interconnect region 15 adjacent to the memory cell array region 12 in the first direction has been described here, interconnects having ring-like contact portions and contact electrodes connected to the interconnects at respective interconnect levels can be formed in also an interconnect region adjacent to the memory cell array region 12 in the second direction by substantially the same processes as those described using FIGS. 14A to 18B except that control lines and the interconnects have different interconnect levels.

Although the masks for forming the ring-like contact portions are formed by combining the side wall masks and the resist masks here, the masks for forming the ring-like contact portions may be formed of only the resist masks.

The resistance change memory as the specific example of the embodiment as shown in FIGS. 8, 9, 10, 11, 12, and 13 is completed by the processes described above.

As described using FIGS. 8 to 13, the interconnects 40A, 40B in the interconnect region 15 include the ring-like contact portions 41A, 41B. The contact electrodes 60A, 60B are electrically connected to the upper interconnects 40A, 40B by coming into contact with the ring portions 48A, 48B of the contact portions 41A, 41B. Together with such configuration, the contact electrodes 60A, 60B are electrically connected to the lower interconnects 50, 51 via the opening portions 49A, 49B of the ring-like contact portions 41A, 41B.

With such configuration, in a semiconductor device such as the resistance change memory in which one contact electrode 60 is disposed across the stacked interconnects 40A, 40B, 50, 51, an alignment of the contact electrodes 60A, 60B to the lower interconnects 50, 51 is determined by the sizes and the positions inside (the opening portions 49A, 49B) of the ring portions 48A, 48B of the contact portions 41A, 41B.

Accordingly, a restriction of an alignment between the respective interconnects 40A, 40B, 50, 51 and the contact electrodes 60A, 60B, for example, a restriction of an alignment between the interconnects and the contact electrodes from a process viewpoint of, for example, an aspect ratio between the interconnects, a change of the size of the interconnects due to a proximity effect, and the like is relaxed.

Therefore, according to the embodiment, a margin can be secured for an alignment offset of the contact electrodes connected between the interconnects having different interconnect levels.

The contact areas between the upper interconnects 40A, 40B having the ring-like contact portions 41A, 41B and the contact electrodes 60A, 60B are determined by the magnitudes (line widths) of the ring portions 48A, 48B of the contact portions 41A, 41B. The contact areas between the lower interconnects 50, 51 and the contact electrodes 60A, 60B are determined by the magnitudes of the opening portions 49A, 49B.

Accordingly, since the contact areas between the respective interconnects 40A, 40B, 50, 51 and the contact electrodes 60A, 60B can be made substantially the same by adjusting (controlling) the sizes of the ring portions 48A, 48B in the contact portions 41A, 41B and the sizes of the opening portions 49A, 49B, a dispersion of the contact resistances can be suppressed. Thus, according to the embodiment, a dispersion of the electric characteristics generated by the respective interconnects can be suppressed.

When the line widths of the ring portions 48A, 48B are increased, since the sizes Xce, Yce of the upper electrode portion 61 can be increased, the contact area between the upper electrode portion 61 of the contact electrode 60 and the contact portion 41 can be increased. As a result, the contact resistances between the upper interconnects 40A, 40B and the contact electrodes 60A, 60B can be reduced.

Further, the areas of the opening portions 49A, 49B are increased. The contact areas between the lower interconnects 50, 51 and the contact electrodes 60A, 60B can be adjusted (controlled) by the sizes of the opening portion portions 49A, 49B. Therefore, since the contact areas between the lower interconnects 50, 51 and the contact electrodes 60A, 60B can be increased by increasing the areas of the opening 49A, 49B, the contact resistances between the contact electrodes 60A, 60B and the lower interconnect layers 50, 51 can be reduced.

As described above, in the embodiment, the contact resistances between the interconnects 50, 51 and the contact electrodes 60A, 60B can be reduced by adjusting the areas of the ring portions 48A, 48B and the opening portions 49A and 49B. Further, the magnitude of the contact areas between the lower interconnects 50, 51 and the contact electrodes 60A, 60B can be the same as magnitude of the contact areas as those between the upper interconnects 40A, 40B and the contact electrodes 60A, 60B by adjusting the line widths of the ring portions 48A, 48B and the areas of the opening portions 49A and 49B. As a result, since the magnitudes of the contact resistances between the upper interconnects 40A, 40B and the contact electrodes 60A, 60B can be made to be the same as those of the contact resistances between the lower interconnects 50, 51 and the contact electrodes 60A, 60B, the dispersion of the contact resistances generated to the respective interconnects can be reduced.

As described above, the manufacturing method of the semiconductor device (for example, the resistance change memory) according to the embodiment can manufacture the semiconductor device in which occurrence of the alignment offset of the interconnects and the dispersion of the electric characteristics of the interconnects are suppressed. As a result, the manufacturing method of the semiconductor device according to the embodiment can provide the semiconductor in which the contact electrodes can be stably connected to the interconnects.

(3) Modification

A modification of the semiconductor device (for example, the resistance change memory) according to the embodiment will be described using FIGS. 20, 21A, 21B, 22A, 22B, and 23.

As described using FIGS. 16A and 18A, a mask pattern whose plane shape is formed in a ring-like mask pattern is formed by combining a curved portion of a side wall mask with a resist mask. A contact portion having a ring-like plane shape is formed to an interconnect by processing a conductive layer based on the ring-like mask pattern.

When one mask pattern is formed by combining the side wall mask and the resist mask, the plane shape of the ring-like contact portion is changed in response to a position where the resist mask is formed to the curved portion of the side wall mask.

FIG. 20 is a plan view showing a layout of the curved portion 94 of the side wall mask and the resist mask 95. The size DX1 of the inside (an opening portion 49X) of the portion of the side wall mask surrounded by the curved portion 94 in the x-direction is set by the size of a projecting portion (refer to FIG. 14B) of a core member for forming the side wall mask in the x-direction (first direction of FIG. 14B), and the size DY1 of the inside (the opening portion 49X) of the portion surrounded by the curved portion 94 in the y-direction is set by the size of the projecting portion of the core member in the y-direction (second direction of FIG. 14B).

To form the ring-like mask pattern, the resist mask 95 is formed from an end to the other end of the side wall mask 93 segmented by the curved portion 94 to bridge the opening portion 49X formed by the curved portion 94 in the x-direction. Accordingly, the size DL1 of the resist mask 95 in the x-direction is set equal to or larger than the size DX1 of the opening portion 49X in the x-direction.

However, to form the ring-like mask pattern, it is necessary to adjust the size DW1 of the resist mask 95 in the y-direction and a position where the resist mask 95 is formed on the curved portion 94 so that the resist mask 95 does not entirely cover the opening portion 49X.

The plane shape of the ring-like contact portion is changed in response to the size DW1 of the resist mask 95 in the y-direction and the position, where the resist mask is formed, to the curved portion 95.

FIGS. 21A and 21B show plane structures of ring-like contact portions 41V, 41X disposed to interconnects in the modification of the semiconductor device (for example, the resistance change memory) of the embodiment, respectively.

When, for example, the size DW1 of the resist mask is larger than the size (line width) MW of the side wall mask 93 in the y-direction in FIG. 20, the ring-like contact portion 41V includes a portion (first portion) 48 curved from an interconnect and a portion (second portion) 47B projecting (swelling) in an opposite direction of the curved portion 48 as shown in FIG. 21A.

Even when the position where the resist mask 95 of FIG. 20 is formed is offset to a side opposite to the side to which the curved portion (ring portion) is curved on the side wall mask, a projecting portion 47A is also formed to the contact portion 41V as shown in FIG. 21A.

The line width (size in the y-direction) RWa of the second portion 47A is thicker than, for example, the line width RW of the first portion 48. Note that the line width RWa of the second portion 47A is thicker than, for example, the line width of an interconnect 40. The line width RW of the ring portion 48 is equal or thicker than, for example, the line width of the interconnect 40. Further, the size dRW1 of the projecting portion in a direction (y-direction) intersecting in the extending direction (x-direction) of the interconnect depends on the projecting magnitude of the resist mask 95 projecting from the interconnect 40 in the y-direction in FIG. 20. When, for example, the width of the interconnect 40 (the line width MW of the side wall mask 93) is thinner than the line width RW of the first portion 48, an alignment margin is reduced when a position where a contact hole is formed is offset to a side opposite to the side to which the mask is curved. To cope with the problem, the alignment margin can be increased when the position where the contact hole is formed is offset to the side opposite to the side to which the mask is curved by making the size DW1 of the resist mask 95 thicker than the line width MW of the side wall mask 93. As a result, a contact electrode can be stably connected to the interconnects.

The size dLA1 of the projecting portion in an interconnect extending direction (x-direction) depends on the size DL1 of the resist mask 95 of FIG. 20 in the x-direction. The size of the projecting portion (second portion) 47A in the x-direction is larger than the size of the inside (opening portion 49) of the ring portion 48 in the x-direction. However, the size dLA1 of the projecting portion in the interconnect extending direction (x-direction) may be smaller or larger than the size RWx of the outside of the ring portion 48 in the x-direction.

In contrast, when the size DW1 of the resist mask 95 of FIG. 20 in the y-direction is smaller than the size (line width of a formed interconnect) MW of the side wall mask 93 in the y-direction or when the position, where the resist mask 95 of FIG. 20 is formed, is offset to a side to which the curved portion (ring portion) 94 projects, the contact portion 41X has a shape in which a portion thereof facing the curved portion of the ring portion 48 is recessed to the side to which the ring portion 48 is curved. Further, the size dRW2 of the recess in a direction (y-direction) intersecting in the interconnect extending direction depends on the magnitude of the resist mask 95 recessed from the interconnect 40 (side wall mask) in FIG. 20 in the y-direction.

Although the example described above shows a structure in which the ring portion and the opening portion of the contact portion disposed to the interconnect have a square plane shape, the plane shape of the contact portion may be deformed in response to a shape of the mask (core member) and an etching condition.

FIGS. 22A and 22B show plane structures of the ring-like contact portions 41Y, 41Z disposed to the interconnects in the modification of the semiconductor device (for example, the resistance change memory) of the embodiment, respectively.

As shown in, for example, FIG. 22A, the plane shape of a ring portion 48Y of a contact portion 41Y may have a pattern including a curved line such as an oval shape and a circular shape. In the case, the plane shape of an opening portion 49Y may also have the oval shape and the circular shape.

Further, as shown in FIG. 22B, the plane shape of a ring portion 48Z of a contact portion 41Z may have a square shape with no corners, and the ring portion 48Z may have a polygonal plane shape. Likewise, an opening portion 49Z may also have a polygonal shape without corners. Further, the ring portion 48Z and the opening portion 49Z may have a square shape without corners.

FIG. 23 shows sectional structures of ring-like contact portions 71X, 71Y and a contact electrode 60Z disposed to interconnects 40X, 40Y in the modification of the semiconductor device (for example, the resistance change memory) of the embodiment.

In the example described above, a case, in which one contact electrode is formed across two stacked interconnects via a ring-like contact portion disposed to the interconnects, will be exemplified. However, as shown in FIG. 23, the contact electrode 60Z may be formed across at least three interconnects 40X, 40Y, 40Z via the ring-like contact portions 71X, 71Y.

Also in the case, the contact areas between the respective interconnects 40X, 40Y, 40Z and the contact electrode 60Z can be made substantially the same by adjusting (controlling) the size D1 of contact holes formed to interlayer insulation films (not shown), the sizes RW1, RW2 of ring portions 78X, 78Y of contact portions 70X, 70Y, and the sizes D2, D3 of opening portions 79X, 79Y of the contact portions 70X, 70Y.

As shown in FIG. 23, when the one contact electrode 60Z passes through the opening portions 79X, 79Y of the contact portions 71X, 71Y, the size D2 of the opening portion 79X of the contact portion 71X positioned to an upper layer is larger than the size D3 of the opening portion 79Y of the contact portion 71Y of a lower layer.

Note that the contact portion 71Y between the contact portion 71X connected to the interconnect 40X and the interconnect 40Z on a substrate 11 may be an intermediate layer which is not connected to any interconnect.

Further, as shown in FIG. 23, respective portions 61, 62, 63 of the contact electrode 60Z may have a taper (trapezoidal) sectional shape with an upper surface side size larger than a bottom surface side size according to the intervals H1, H2, H3 of the stacked interconnects 40X, 40Y, 40Z. The intervals H1, H2, H3 correspond to, for example, the film thickness of the interlayer insulation films (not shown) interposed between the interconnects.

The same effect as those of the basic example and the applied example described above can also be obtained even in the modification of the semiconductor device of the embodiment (for example, the resistance change memory) shown in FIGS. 21A, 21B, 22A, 22B, and 23.

Note that all the contact portions of the semiconductor device (for example, the resistance change memory) need not have the same plane shape as long as the plane shape of the contact portions have the ring-like plane shape, and the plane shape of the contact portions may be a square shape in certain interconnects and may be an oval shape in the other interconnects.

As described above, the contact electrodes can be stably connected to the interconnects also in the modification of the semiconductor device of the embodiment.

[Other]

The semiconductor device according to the embodiment can be applied to resistance change memories such as ReRAM and PCRAM.

Although the resistance change memory having the cross point type memory cell array has been described in the embodiment, the embodiment is not limited thereto. The ring-like contact portions described in the embodiment can be applied to, for example, interconnects of a flash memory (BiCS memory) formed by, for example, a BiCS (Bit Cost Scalable) technology. Further, it is needless to say that the embodiment can be applied to a semiconductor integrated circuit such as a logic circuit in addition to the memories described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate; and
   an interconnect region on the substrate, the interconnect region including a first interconnect having a first contact portion whose plane shape is a ring-like plane shape, a second interconnect disposed below the first interconnect, and a contact electrode passing through the ring-like portion of the first contact portion and electrically connecting the first interconnect and the second interconnect,
   wherein the first contact portion includes:
   a first portion projecting from the first interconnect in a direction intersecting the extending direction of the first interconnect; and
   a second portion projecting to a side opposite to the side to which the first portion projects,
   wherein the line width of the second portion is wider than the line width of the first portion.

2. The semiconductor device according to claim 1, wherein the interconnect region further includes a third interconnect having a second contact portion whose plane shape is a ring-like plane shape, and is disposed at a position adjacent to the first interconnect in a plane, the first contact portion projects to the third interconnect side with respect to the surface of the substrate in a horizontal direction, and the second contact portion projects to the first interconnect side with respect to the surface of the substrate in the horizontal direction.

3. The semiconductor device according to claim 2, wherein the first contact portion and the second contact portion project in an alternate direction.

4. The semiconductor device according to claim 1, wherein the interconnect region further includes a fourth interconnect having a third contact portion whose plane shape is a ring-like plane shape, and is disposed at an interconnect level different from the first interconnect, and the third contact portion is disposed at a position which does not overlap the first contact portion in a vertical direction with respect to the surface of the substrate.

5. The semiconductor device according to claim 1, wherein the contact electrode includes:

a first electrode portion on the upper surface of the first contact portion; and a second electrode portion passing through a ring-like portion of the first contact portion and in contact with the second interconnect, and the size of the first electrode portion in the horizontal direction with respect to the surface of the substrate is larger than the size of the second electrode portion in the horizontal direction with respect to the surface of the substrate.

6. The semiconductor device according to claim 5, wherein the second electrode portion is in contact with a side surface of an opening portion of the contact portion and with the upper surface of the second interconnect.

7. The semiconductor device according to claim 1, further comprising:

a cross point type memory cell on the substrate adjacent to the interconnect region, the cross point type memory cell including a first control line extending in a first direction, a second control line extending in a second direction intersecting the first direction, and a cell unit disposed at a position where the first control line intersects the second control line and including a memory device for storing data in response to a reversible change of a resistance state.

8. The semiconductor device according to claim 7, wherein the first control line is disposed at the same interconnect level as the first interconnect.

9. The semiconductor device according to claim 7, wherein the first interconnect is connected to the first control line.

10. A semiconductor device comprising:

a substrate;

an interconnect region on the substrate, the interconnect region including a first interconnect having a first contact portion whose plane shape is a ring-like plane shape, a second interconnect disposed below the first interconnect, and a contact electrode passing through the ring-like portion of the contact portion and electrically connecting the first interconnect and the second interconnect; and a memory array region on the substrate adjacent to the interconnect region, the memory array region including a first control line extending in a first direction, a second control line extending in a second direction intersecting the first direction, a third control line extending in the first direction and disposed at an interconnect level different from the first control line, and cell units having a memory device connected to the first and second control lines and connected to the second and third control lines, respectively, wherein the first contact portion includes:

a first portion projecting from the first interconnect in a direction intersecting the extending direction of the first interconnect; and a second portion projecting to a side opposite to the side to which the first portion projects wherein the line width of the second portion is wider than the line width of the first portion.

11. The semiconductor device according to claim 10, wherein the interconnect region further includes a third interconnect having a second contact portion whose plane shape is a ring-like plane shape and disposed at the same interconnect level as the third control line, and the second contact portion is disposed at a position which does not overlap the first contact portion in a vertical direction with respect to the surface of the substrate.

12. The semiconductor device according to claim 10, wherein the interconnect region further includes a fourth interconnect having a third contact portion whose plane shape is a ring-like plane shape and disposed at a position adjacent to the first interconnect in a plane, the first contact portion projects to the fourth interconnect side in a horizontal direction with respect to the surface of the substrate, and the third contact portion projects to the first interconnect side in the horizontal direction with respect to the surface of the substrate.

13. The semiconductor device according to claim 11, wherein the first contact portion and the second contact portion project in an alternate direction.

14. The semiconductor device according to claim 10, wherein the contact electrode includes:

a first electrode portion on the upper surface of the first contact portion; and a second electrode portion passing through the ring-like portion of the first contact portion and in contact with the second interconnect, and the size of the first electrode portion in the horizontal direction with respect to the surface of the substrate is larger than the size of the second electrode portion on the surface of the substrate.

15. The semiconductor device according to claim 10, wherein the first control line is disposed at the same interconnect level as the first interconnect, and the second control line is disposed at the same interconnect level as the second interconnect.

16. The semiconductor device according to claim 10, wherein the first interconnect is connected to the first control line, and the second interconnect is connected to the second control line.

* * * * *